(12) United States Patent
Park et al.

(10) Patent No.: US 11,864,438 B2
(45) Date of Patent: *Jan. 2, 2024

(54) DISPLAY PANEL INCLUDING AN OPENING AREA FOR ACCOMMODATING ELECTRONIC COMPONENTS THEREIN

(71) Applicant: Samsung Display Co., Ltd., Yongin-Si (KR)

(72) Inventors: Hyunae Park, Yongin-si (KR); Jaewon Kim, Yongin-si (KR); Hyungjun Park, Yongin-si (KR); Junyong An, Yongin-si (KR); Nuree Um, Yongin-si (KR); Ilgoo Youn, Yongin-si (KR); Jieun Lee, Yongin-si (KR); Donghyeon Jang, Yongin-si (KR); Seunghan Jo, Yongin-si (KR); Junyoung Jo, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 72 days.

This patent is subject to a terminal disclaimer.

(21) Appl. No.: 17/504,403

(22) Filed: Oct. 18, 2021

(65) Prior Publication Data

US 2022/0037455 A1 Feb. 3, 2022

Related U.S. Application Data

(63) Continuation of application No. 16/697,039, filed on Nov. 26, 2019, now Pat. No. 11,152,449.

(30) Foreign Application Priority Data

Nov. 30, 2018 (KR) .......................... 10-2018-0153022

(51) Int. Cl.
*H01L 27/14* (2006.01)
*H10K 59/131* (2023.01)
*H10K 77/10* (2023.01)

(52) U.S. Cl.
CPC ........... *H10K 59/131* (2023.02); *H10K 77/10* (2023.02)

(58) Field of Classification Search
CPC ............................ H10K 59/131; H10K 77/10
(Continued)

(56) References Cited

U.S. PATENT DOCUMENTS 9,940,888 B2 4/2018 Ryoo et al.
10,134,826 B2 11/2018 Ka et al.
(Continued)

FOREIGN PATENT DOCUMENTS

EP 3176771 A2 6/2017
EP 3648093 A1 5/2020
(Continued)

*Primary Examiner* — Phuc T Dang
(74) *Attorney, Agent, or Firm* — Innovation Counsel LLP

(57) ABSTRACT

A display panel may include the following elements: a substrate including an opening area, a display area surrounding the opening area, and a first non-display area between the opening area and the display area; a data line positioned at a first side relative to the opening area; a first scan line; a second scan line; a first pixel connected to the data line and the first scan line; a second pixel connected to the data line and the second scan line; a first emission control line connected to the first pixel; a connecting section positioned on the first non-display area; a second emission control line connected to the second pixel and connected through the connecting section to the first emission control line; and an emission control driver configured to simultaneously provide emission control signals to the first emission control line and the second emission control line.

22 Claims, 23 Drawing Sheets

(58) Field of Classification Search
USPC ............................................................ 257/72
See application file for complete search history.

(56) References Cited

U.S. PATENT DOCUMENTS

| | | |
|---|---|---|
| 10,964,771 B2 | 3/2021 | Lee et al. |
| 11,152,449 B2* | 10/2021 | Park ........................ H10K 77/10 |
| 2008/0230767 A1* | 9/2008 | Jung .................... H01L 27/1248 |
| | | 257/E33.001 |
| 2016/0077395 A1 | 3/2016 | Ki |
| 2016/0293889 A1* | 10/2016 | Nakamura ......... H10K 50/8445 |
| 2017/0141172 A1* | 5/2017 | Cho ..................... H10K 59/123 |
| 2017/0288003 A1 | 10/2017 | Kim et al. |
| 2017/0373129 A1 | 12/2017 | Kim et al. |
| 2018/0062107 A1* | 3/2018 | Kim ..................... H10K 59/131 |
| 2018/0277610 A1 | 9/2018 | Kubota et al. |
| 2018/0279485 A1 | 9/2018 | Hillman et al. |
| 2019/0051670 A1 | 5/2019 | Bei et al. |
| 2019/0304356 A1 | 10/2019 | Ka et al. |

FOREIGN PATENT DOCUMENTS

| | | |
|---|---|---|
| KR | 10-2017-0064598 A | 6/2017 |
| KR | 10-2017-0114026 A | 10/2017 |
| KR | 10-2017-0117291 A | 10/2017 |
| KR | 10-2017-0119270 A | 10/2017 |

* cited by examiner

DISPLAY PANEL INCLUDING AN OPENING AREA FOR ACCOMMODATING ELECTRONIC COMPONENTS THEREIN

CROSS-REFERENCE TO RELATED APPLICATION(S)

This application is a continuation application of U.S. patent application Ser. No. 16/697,039 filed on Nov. 26, 2019 (now U.S. Pat. No. 11,152,449), which claims priority to and the benefit of Korean Patent Application No. 10-2018-0153022, filed on Nov. 30, 2018, in the Korean Intellectual Property Office; the disclosure of the Korean Patent Application is incorporated herein in its entirety by reference.

BACKGROUND

1. Field

The technical field relates to a display panel.

2. Description of the Related Art

A display panel may be included in an electronic device for displaying images. In addition to displaying images, the display panel may facilitate other functions of the electronic device. For example, the display panel may enable a user interface of the electronic device.

SUMMARY

One or more embodiments may be related to a display panel including an opening area for accommodating at least one of a camera, a sensor, etc. and may be related to a device and/or an electronic device including the display panel.

According to one or more embodiments, a display panel includes: a substrate including an opening area, a display area surrounding the opening area, a first non-display area between the opening area and the display area, and a second non-display area outside the display area; a plurality of data lines extending in a first direction and detouring around the opening area; a plurality of scan lines arranged in a second direction that intersects with the first direction, the plurality of scan lines being arranged on two opposite sides of the opening area; a plurality of emission control lines arranged in the second direction and including first emission control lines and second emission control lines, the first emission control lines connected to each other, on an adjacent two line-basis, on a first side of the opening area, and the second emission control lines being connected to each other, on an adjacent two line-basis, on a second side of the opening area that faces the first side; and an emission control driver arranged in the second non-display area and configured to simultaneously provide emission control signals to the emission control lines connected to each other on the adjacent two-line basis.

The first emission control line and the second emission control line may be connected to one emission control detour line detouring around the opening area.

The emission control detour line may be arranged between adjacent data lines detouring the opening area in the second non-display area.

The emission control detour line may be formed on a layer different from those of the first emission control line and the second emission control line.

An insulating layer may be further arranged between the emission control detour line, the first emission control line, and the second emission control line, and the emission control detour line, the first emission control line, and the second emission control line may contact each other through a contact hole formed in the insulating layer.

Emission control detour lines that are adjacent to each other among the emission control detour lines may be respectively provided on different layers.

The emission control detour line may be provided on the same layer on which the first emission control line and the second emission control line are arranged.

The emission control detour line, the first emission control line, and the second emission control line may include the same material.

The first emission control line may include a (1-1)st emission control line and a (1-2)nd emission control line that is adjacent to the (1-1)st emission control line, the second emission control line may include a (2-1)st emission control line and a (2-2)nd emission control line that is adjacent to the (2-1)st emission control line, a first emission control driver may simultaneously supply signals to two emission control lines connected to the (1-1)st emission control line, and a second emission control driver may simultaneously supply signals to two emission control lines connected to the (2-2)nd emission control line.

The first emission control driver may be arranged by one per four adjacent emission control lines on a first side of the second non-display area, and the second emission control driver may be arranged by one per four adjacent emission control lines on a second side of the second non-display area that faces the first side.

The first emission control line and the second emission control line may be separated from each other with the opening area therebetween.

The first emission control line and the second emission control line may be provided on the same layer.

The first emission control line and the second emission control line may include the same material.

The first emission control line may include a (1-1)st emission control line and a (1-2)nd emission control line that is adjacent to the (1-1)st emission control line, the second emission control line may include a (2-1)st emission control line and a (2-2)nd emission control line that is adjacent to the (2-1)st emission control line, a first emission control driver may simultaneously supply signals to two emission control lines connected to the (1-1)st emission control line, and a second emission control driver may simultaneously supply signals to two emission control lines connected to the (2-2)nd emission control line.

The first emission control driver may be arranged by one per two adjacent emission control lines on a first side of the second non-display area, and the second emission control driver may be arranged by one per two adjacent emission control lines on a second side of the second non-display area that faces the first side.

The display panel may further include: previous scan lines arranged in the second direction and arranged on two opposite sides of the opening area; and a scan driver arranged in the second non-display area and configured to transfer scan signals to the scan line and the previous scan line.

The scan line may extend by detouring around an edge of the opening area, and the previous scan line may be spaced apart from the scan line and extend by detouring around the edge of the opening area.

The scan line and the previous scan line may respectively include different materials.

The display area may include a plurality of pixels, the scan line and the previous scan line may be arranged together in one pixel, and the scan line and the previous scan line arranged together in one pixel may be connected to each other on two opposite sides of the opening area and connected through one scan detour line detouring around the opening area.

Scan detour lines that are adjacent to each other among the scan detour lines may be arranged on different layers.

The scan detour line may be arranged on a layer different from layers on which the scan line and the previous scan line are arranged.

The scan lines and the previous scan lines arranged on two opposite sides of the opening area may be separated from each other with the opening area therebetween.

Portions of the scan line and the previous scan line that are close to the opening area may be connected to each other.

Portions of the scan line and the previous scan line that are close to the opening area may not be connected to each other.

The display area may include a plurality of pixels, the scan line and the previous scan line may be arranged together in one pixel, and the scan line and the previous scan line arranged together in one pixel may be connected to each other on two opposite sides of the opening area, the scan driver may include a first scan driver and a second scan driver, the first scan driver may be arranged by one per the scan line and the previous scan line included in one pixel on a first side of the second non-display area, and the second scan driver may be arranged by one per the scan line and the previous scan line included in one pixel on a second side of the second non-display area that faces the first side.

A display panel may include the following elements: a substrate including an opening area, a display area surrounding the opening area, a first non-display area between the opening area and the display area, and a second non-display area outside the display area; a first data line positioned at a first side relative to the opening area in a plan view of the display panel; a first scan line; a second scan line; a first pixel electrically connected to each of the first data line and the first scan line; a second pixel electrically connected to each of the first data line and the second scan line; a first emission control line electrically connected to the first pixel; a first connecting section positioned on the first non-display area; a second emission control line electrically connected to the second pixel and electrically connected through the first connecting section to the first emission control line; and a first emission control driver positioned on the second non-display area and configured to simultaneously provide emission control signals to the first emission control line and the second emission control line.

The display panel may include the following elements: a second data line positioned at a second side relative to the opening area in the plan view of the display panel, wherein the opening area may be positioned between the first data line and the second data line; a third pixel electrically connected to each of the second data line and the first scan line; and a fourth pixel electrically connected to each of the second data line and the second scan line. The second emission control line may be electrically connected to the fourth pixel and may include a first emission control detour section. The first emission control detour section may bypass the opening area.

The display panel may include the following elements: a third data line, which includes a first data detour section, the first data detour section bypassing the opening area and being positioned on the first non-display area; and a fourth data line, which includes a second data detour section, the second data detours section bypassing the opening area and being positioned on the first non-display area. The first emission control detour section may be arranged between the first data detour section and a second data detour section.

The display panel may include a first insulating layer having a first contact hole. The second emission control line may include a first pixel-connecting section. The first emission control detour section may be connected to the first pixel-connecting section through the first contact hole and may be electrically connected to the second pixel through the first pixel-connecting section.

The display panel may include a second insulating layer having a second contact hole. The first emission control detour section may be connected to the first pixel-connecting section through the second contact hole.

The display panel may include a second emission control detour section immediately adjacent to the first emission control detour section with no intervening emission control detour section being positioned between the first emission control detour section and the second emission control detour section. The first emission control detour section and the second emission control detour section may respectively directly contact different insulating layers.

The display panel may include a first insulating layer. The second emission control line may include a first pixel-connecting section. The first emission control detour section may be electrically connected to the second pixel through the first pixel-connecting section. The first emission control detour section and the first pixel-connecting section may directly contact a same face of the first insulating layer.

A material of the first emission control detour section may be identical to a material of the first pixel-connecting section.

The display panel may include the following elements: a first opposite emission control line positioned opposite the first emission control line and electrically connected to the third pixel; and a second emission control driver positioned on the second non-display area and configured to simultaneously provide signals to the first opposite emission control line and the second emission control line.

The first emission control driver may be electrically connected to four adjacent emission control lines positioned at the first side relative to the opening display area. The second emission control driver may be electrically connected to four adjacent emission control lines positioned at the second side relative to the opening area.

The display panel may include the following elements: a second data line positioned at a second side relative to the opening area in the plan view of the display panel, wherein the opening area may be positioned between the first data line and the second data line; a third pixel electrically connected to each of the second data line and the first scan line; and a first opposite emission control line positioned opposite the first emission control line and electrically connected to the third pixel, wherein the opening area may be positioned between the first emission control line and the first opposite emission control line.

The display panel may include an insulating layer. The first emission control line and the first opposite emission control line may directly contact a same surface of the insulating layer.

A material of the first emission control line may be identical to a material of the first opposite emission control line.

The display panel may include the following elements: a fourth pixel electrically connected to each of the second data line and the second scan line; a first opposite connecting section positioned opposite the first connecting section and positioned on the first non-display area; a second opposite emission control line electrically connected to the fourth pixel and electrically connected through the first opposite connecting section to the first opposite emission control line; and a second emission control driver positioned on the second non-display area and configured to simultaneously supply signals to the first opposite emission control line and the second opposite emission control line.

Each of the first connecting section and the first opposite connecting section may conform to an arc of a geometric circle. The geometric circle may be concentric with a perimeter the opening area in the plan view of the display panel.

The display panel may include the following elements: a second data line positioned at a second side relative to the opening area in the plan view of the display panel, wherein the opening area may be positioned between the first data line and the second data line; a third pixel electrically connected to each of the second data line and the first scan line; a first previous scan line electrically connected to each of the first pixel and the third pixel; and a first scan driver arranged on the second non-display area and configured to provide scan signals to both the first scan line and the first previous scan line. The first scan line may be electrically connected to a gate electrode of a first transistor of the first pixel. The first previous scan line may be electrically connected to a gate electrode of a second transistor of the first pixel.

The first scan line may include a first scan detour section. The first scan detour section may bypass the opening area. The first previous scan line may include a first previous scan detour section. The first previous scan detour section may be spaced from the first scan detour section and may bypass the opening area.

A material of the first scan line may be different from a material of the first previous scan line.

The display panel may include a first scan detour section. The first scan detour section may bypass the opening area. Each of the first scan line and the first previous scan line may be electrically connected to the first scan detour section.

The display panel may include the following elements: a second previous scan line electrically connected to the second pixel; and a second scan detour section. The second scan detour section may bypass the opening area, may be electrically connected to each of the second scan line and the second previous scan line, and immediately neighbors the second scan detour section with no intervening scan detour section being positioned between the first scan detour section and the second scan detour section. The first scan detour section and the second scan detour section respectively directly contact different insulating layers.

The first scan detour line may directly contact a first insulating layer. The first scan line and the first previous scan line may directly contact a second insulating layer different from the first insulating layer.

The display panel may include the following elements: a second data line positioned at a second side relative to the opening area in the plan view of the display panel, wherein the opening area may be positioned between the first data line and the second data line; a first opposite scan line positioned opposite the first scan line, wherein the opening area may be positioned between the first scan line and the first opposite scan line; a third pixel electrically connected to each of the second data line and the first opposite scan line; a first previous scan line electrically connected to the first pixel; and a first opposite previous scan line positioned opposite the first previous scan line and electrically connected to the third pixel, wherein the opening area may be positioned between the first previous scan line and the first opposite previous scan line.

The display panel may include the following elements:

a first scan-connecting section positioned on the first non-display area, wherein the first scan line may be electrically connected through the first scan-connecting section to the first previous scan line; and a first opposite scan-connecting section positioned opposite the first scan-connecting section and positioned on the first non-display area, wherein the first opposite scan line may be electrically connected through the first opposite scan-connecting section to the first opposite previous scan line.

An end of the first scan line and an end of the first previous scan line may be spaced from each other and may be not electrically connected to each other. At least one of the end of the first scan line and the end of the first previous scan line may be positioned at a boundary of the first non-display area.

The display panel may include a second scan driver positioned on the second non-display area and configured to provide signals to both the first scan line and the first previous scan line. Each of the opening area, the first non-display area, and the display area may be positioned between the first scan driver and the second scan driver.

DETAILED DESCRIPTION

Figure 1:
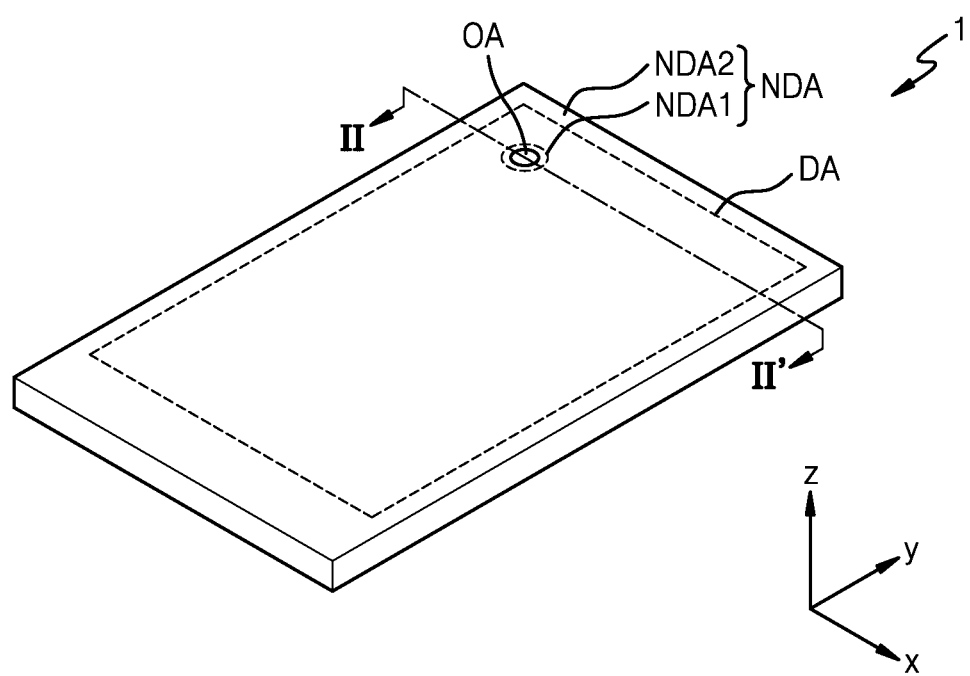
FIG. 1 is a perspective view of a display device according to an embodiment.

Example embodiments are described with reference to the drawings. Practical embodiments may be embodied in many different forms and should not be construed as limited to the example embodiments.

Like reference numerals in the drawings may denote like or corresponding elements, and descriptions related to the elements may not be repeated.

Expressions such as "at least one of" when preceding a list of elements, may modify the entire list of elements and may not modify the individual elements of the list.

Although the terms "first," "second," etc. may be used to describe various elements, these elements should not be limited by these terms. These terms may be used to distinguish one element from another. A first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

The singular forms "a", "an" and "the" may include the plural forms as well, unless the context clearly indicates otherwise.

The terms "comprises/includes" and/or "comprising/including" may specify the presence of stated features or components, but do not preclude the presence or addition of one or more other features or components.

When a first element is referred to as being "on" or "connected to" a second element, the first element can be directly or indirectly on or connected to the second element, and one or more intervening elements may be present between the first element and the second element.

Sizes of elements in the drawings may be exaggerated for convenience of explanation.

When a certain embodiment may be implemented differently, a specific process order may be performed differently from the described order. For example, two consecutively described processes may be performed substantially at the same time or performed in an order opposite to the described order.

The term "detour" may mean "bypass." The term "connect" may mean "electrically connect." The term "conductive" may mean "electrically conductive." The term "insulate" may mean "electrically insulate." The term "line" may mean "section" or "set of sections." The term "opening area" may mean "opening" or "area corresponding to an opening." The term "around the opening area" may mean "at/on/in the first non-display area." The term "portion" may mean "section." The term "row" may mean "pixel row." The term "column" may mean "pixel column." The term "on different layers" may mean "respectively directly contacting different insulating layers." The term "on the same layer" may mean "directly contacting the same face/surface of the same insulating layer."

FIG. 1 is a perspective view of a display device 1 according to an embodiment.

Referring to FIG. 1, the display device 1 includes a display area DA that emits light and a non-display area NDA that does not emit light. The non-display area NDA is adjacent to the display area DA. The display device 1 may provide an image using light emitted from a plurality of pixels arranged in the display area DA.

The display device 1 includes an opening area OA that is at least partially surrounded by the display area DA. In an embodiment, it is shown in FIG. 1 that the opening area OA is entirely surrounded by the display area DA. The non-display area NDA may include a first non-display area NDA1 surrounding the opening area OA, and a second non-display area NDA2 surrounding an outer periphery of the display area DA. The first non-display area NDA1 may entirely surround the opening area OA, the display area DA may entirely surround the first non-display area NDA1, and the second non-display area NDA2 may entirely surround the display area DA.

In embodiments, the display device may be an organic light emitting display device, an inorganic light-emitting display device, or a quantum dot light-emitting display device.

The number(s) and location(s) of one or more opening areas OA may be configured according to embodiments.

Figure 2:
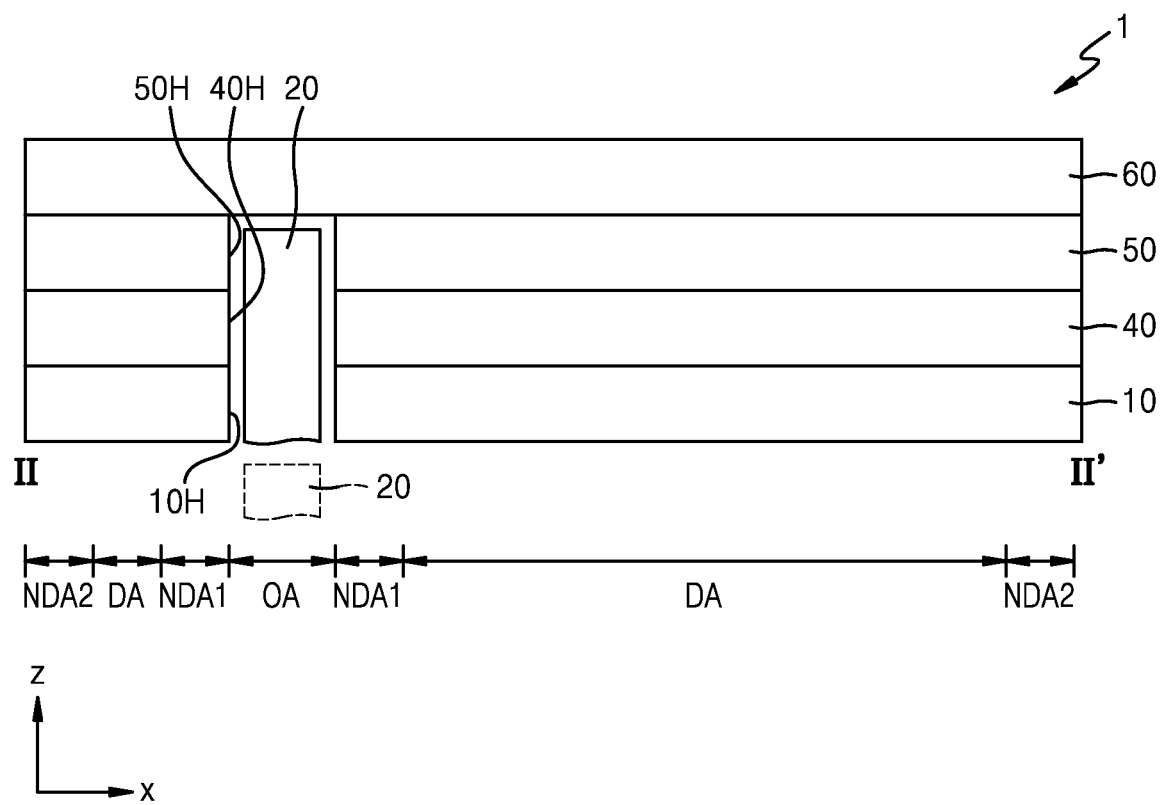
FIG. 2 is a cross-sectional view of a display device according to an embodiment.

FIG. 2 is a cross-sectional view of corresponding to a cross-section taken along line II-II' of FIG. 1 according to an embodiment.

Referring to FIG. 2, the display device 1 may include a display panel 10 and may include an input sensing layer 40 and an optical functional layer 50 arranged on the display panel 10. These layers may be covered by a window 60. The display device 1 may be or may be included in an electronic device, such as a mobile phone, a notebook computer, or a smartwatch.

The display panel 10 may display an image. The display panel 10 includes pixels arranged in the display area DA. Each of the pixels may include a display element and a pixel circuit connected to the display element. The display element may include an organic light-emitting diode, an inorganic light-emitting diode, or a quantum dot light-emitting diode.

The input sensing layer 40 obtains coordinate information corresponding to an external input, for example, a touch event. The input sensing layer 40 may include a sensing electrode (or a touch electrode) and trace lines connected to the sensing electrode. The input sensing layer 40 may be arranged on the display panel 10. The input sensing layer 40 may sense an external input using a mutual capacitance method and/or a self-capacitance method.

The input sensing layer 40 may be directly formed on the display panel 10 or may be formed separately and then coupled using an adhesive layer such as an optical clear adhesive (OCA). The input sensing layer 40 may be successively formed after a process of forming the display panel 10. No adhesive layer may be arranged between the input sensing layer 40 and the display panel 10. The optical functional layer 50 may be positioned between the display panel 10 and the input sensing layer 40 in an embodiment.

The optical functional layer 50 may include a reflection prevention layer. The reflection prevention layer may reduce light that is reflected from the display panel 10 and transmitted through the window 60. The reflection prevention layer may include a retarder and a polarizer. The retarder may include a film-type retarder or a liquid crystal-type retarder. The retarder may include a λ/2 retarder and/or a λ/4 retarder. The polarizer may include a film-type polarizer or a liquid crystal-type polarizer. The film-type polarizer may include a stretchable synthetic resin film, and the liquid crystal-type polarizer may include liquid crystals arranged in a predetermined arrangement. Each of the retarder and the polarizer may further include a protective film. The retarder and the polarizer themselves or their protective films may be a base layer of the reflection prevention layer.

In an embodiment, the reflection prevention layer may include a black matrix and color filters. The color filters may be arranged by taking into account colors of light emitted from pixels of the display panel 10. In an embodiment, the reflection prevention layer may include a destructive interference structure. The destructive interference structure may include a first reflection layer and a second reflection layer respectively arranged in different layers. First reflected light and second reflected light respectively reflected by the first reflection layer and the second reflection layer may create destructive-interference and thus unwanted reflected light may be reduced.

The optical functional layer 50 may include a lens layer. The lens layer may improve emission efficiency of light emitted from the display panel 10 or reduce color deviation of the light. The lens layer may include a layer having concave or convex lens structures and/or include a plurality of layers respectively having different refractive indexes. The optical functional layer 50 may include both the reflection prevention layer and the lens layer or include one of the reflection prevention layer and the lens layer.

The display panel 10, the input sensing layer 40, and/or the optical functional layer 50 may include an opening. FIG. 2 shows that the display panel 10, the input sensing layer 40, and the optical functional layer 50 respectively include openings 10H, 40H, and 50H corresponding to each other. The openings 10H, 40H, and 50H correspond to the opening area OA. In an embodiment, at least one of the display panel 10, the input sensing layer 40, and the optical functional layer 50 may not include an opening. For example, one or two of the display panel 10, the input sensing layer 40, and the optical functional layer 50 may not include an opening. The opening area OA may be or may correspond to at least one of the f openings 10H, 40H, or 50H. For example, the opening area OA may be or may correspond to the first opening 10H of the display panel 10.

A component 20 may be positioned at the opening area OA. As shown by a solid line of FIG. 2, the component 20 may be located inside the openings 10H, 40H, and 50H. As shown by a dashed line, the component 20 may correspond to at least one of the openings 10H, 40H, and 50H and may be located beyond the display panel 10.

The component 20 may include an electronic element. For example, the component 20 may include an electronic element that uses light or sound. For example, an electronic element may be a sensor such as an infrared sensor that emits and/or receives light, a camera that receives light and captures an image, a sensor that outputs and senses light or sound to measure a distance or recognize a fingerprint, a small lamp that outputs light, or a speaker that outputs sound. An electronic element that uses light may use light in one or more of various wavelength bands such as at least one of visible light, infrared light, and ultraviolet light. In an embodiment, the opening area OA may be a transmission area through which light and/or sound, provided and/or received by the component 20, may pass.

In an embodiment, the display device 1 may be used in a smartwatch or an instrument panel for an automobile, and the component 20 may be a member including a needle of a clock or including a needle for indicating information (e.g., the velocity of a vehicle). The component 20 may be exposed through the window 60, which may include an opening corresponding to the opening area OA.

The component 20 may include one or more elements related to a function of the display panel 10 and/or related to an esthetic design of the display panel 10. Though not shown in FIG. 2, an adhesive layer (e.g., an OCA layer) may be located between the window 60 and the optical functional layer 50.

Figure 3A:
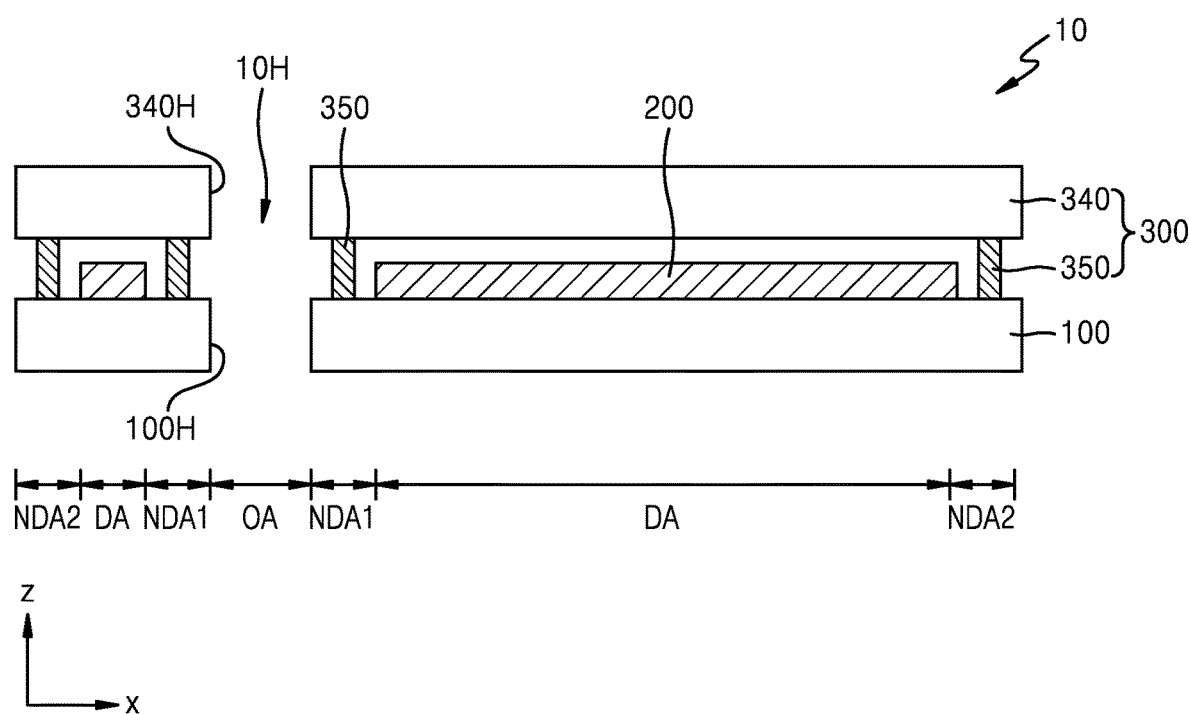
FIG. 3A is a cross-sectional view of a display panel according to an embodiment.
Figure 3B:
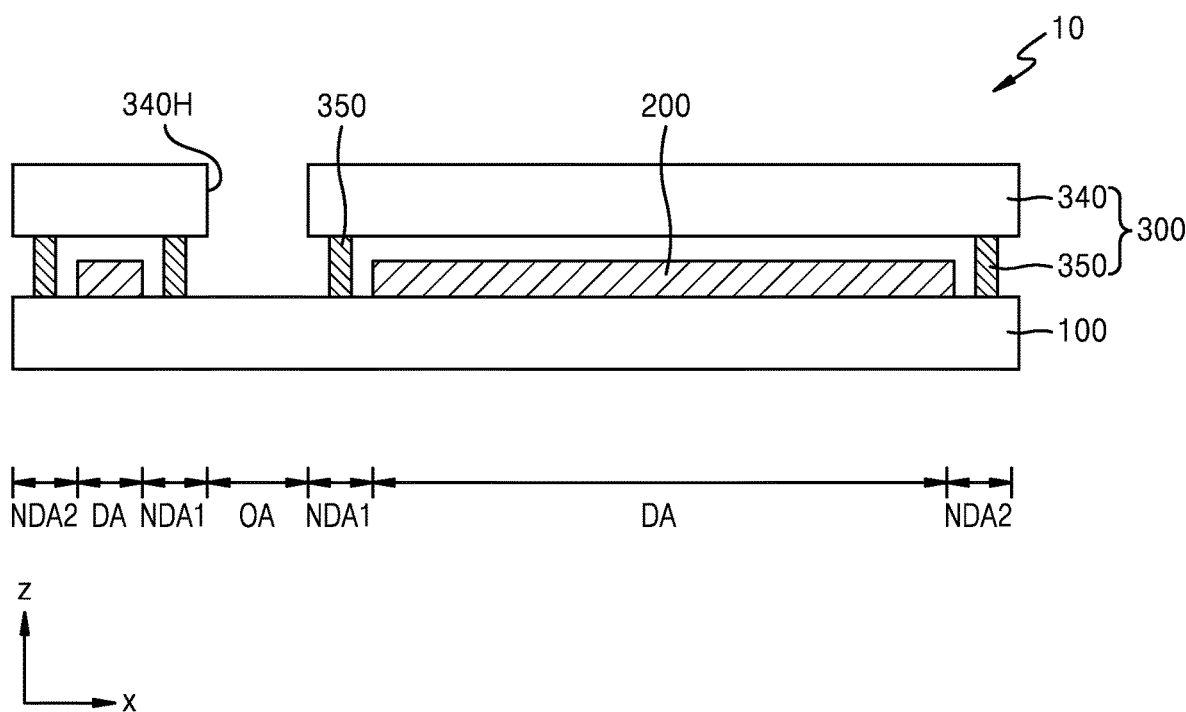
FIG. 3B is a cross-sectional view of a display panel according to an embodiment.
Figure 3C:
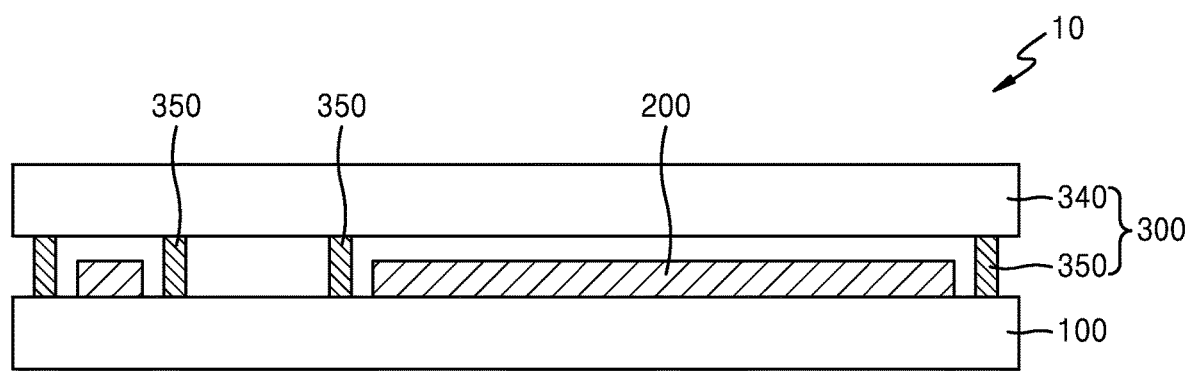
FIG. 3C is a cross-sectional view of a display panel according to an embodiment.

Each of FIGS. 3A to 3C shows a cross-sectional view of the display panel 10 according to an embodiment.

Referring to FIGS. 3A to 3C, the display panel 10 includes a display element layer 200 arranged on a substrate 100. The substrate 100 may include a glass material or a polymer resin. For example, the substrate 100 may include $SiO_2$ or may include a reinforced plastic.

The display element layer 200 may correspond to the display area DA and includes a plurality of pixels. The display element layer 200 includes a pixel circuit corresponding to each pixel and a display element electrically connected to the pixel circuit. The pixel circuit may include a thin film transistor and a storage capacitor, and the display element may include an organic light-emitting diode OLED.

As part of an encapsulation member 300, an encapsulation substrate 340 overlaps the substrate 100. A sealing material 350 is arranged between the substrate 100 and the encapsulation substrate 340. The sealing material 350 surrounds the display element layer 200 between the substrate 100 and the encapsulation substrate 340. The sealing material 350 may be surrounded by a first edge (also referred to as an inner edge) of the display element layer 200 in the first non-display area NDA1 and may surround a second edge (also referred to as an outer edge) of the display element layer 200 in the second non-display area NDA2. When viewed in a direction perpendicular to a main surface, the opening area OA may be entirely surrounded by the sealing material 350, and the second edge of the display element layer 200 may be also entirely surrounded by the sealing material 350.

The display panel 10 may include the first opening 10H corresponding to the opening area OA. FIG. 3A shows that the substrate 100 and the encapsulation substrate 340 respectively include through holes 100H and 340H corresponding to the opening area OA. The display element layer 200 may also include a through hole corresponding to the opening area OA.

In another embodiment, as shown in FIG. 3B, the encapsulation substrate 340 may include a through hole 340H corresponding to the opening area OA, but the substrate 100 may not include a through hole. In another embodiment, as shown in FIG. 3C, the substrate 100 and the encapsulation substrate 340 may not respectively include through holes corresponding to the opening area OA. The display element layer 200 may include a through hole corresponding to the opening area OA. In another embodiment, the sealing material 350 arranged in the first non-display area NDA1 of the display panel 10 may be unnecessary. The display element layer 200 may not include a through hole corresponding to the opening area OA. A component 20 (see FIG. 2) that does not require a relatively high transmittance may be arranged in the opening area OA. Even if the display element layer 200 does not include a through hole corresponding to the opening area OA, a portion of the display element layer 200 that corresponds to the opening area OA may provide sufficient transmittance.

Figure 4A:
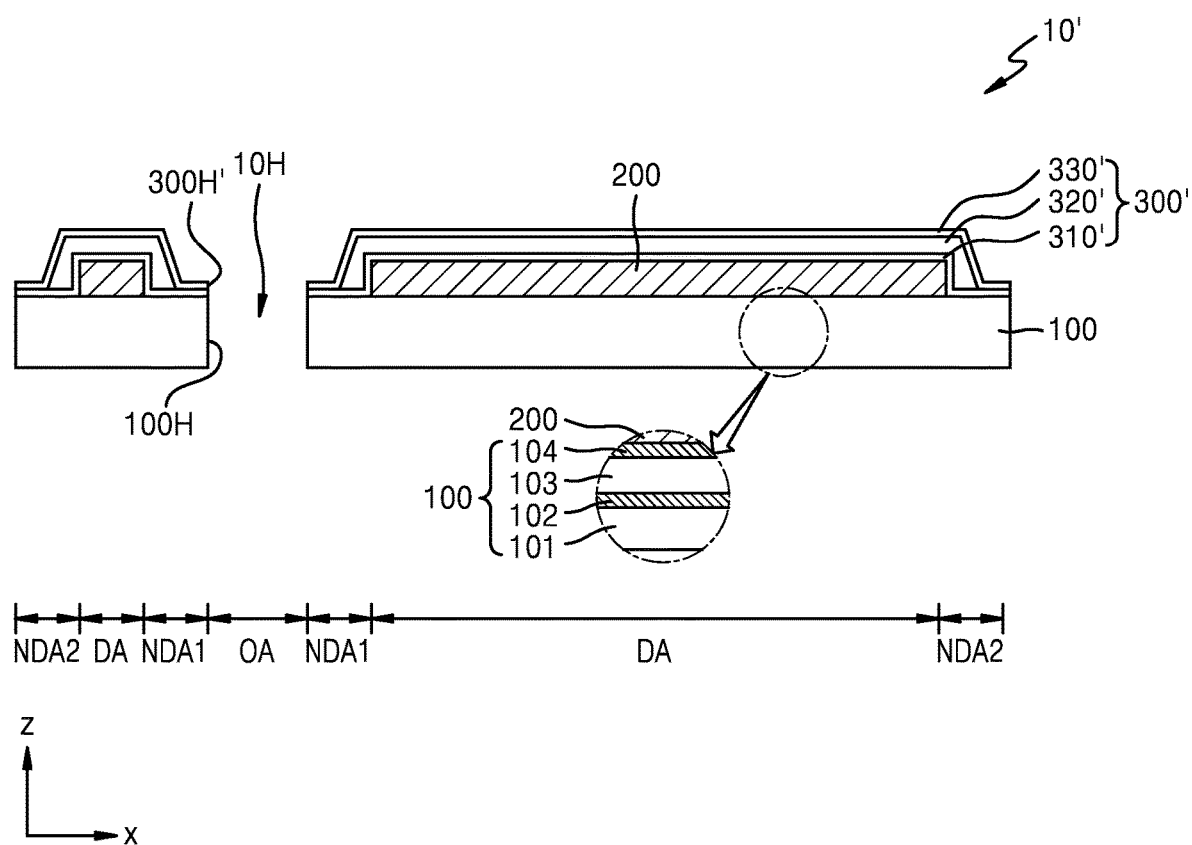
FIG. 4A is a cross-sectional view of a display panel according to an embodiment.
Figure 4B:
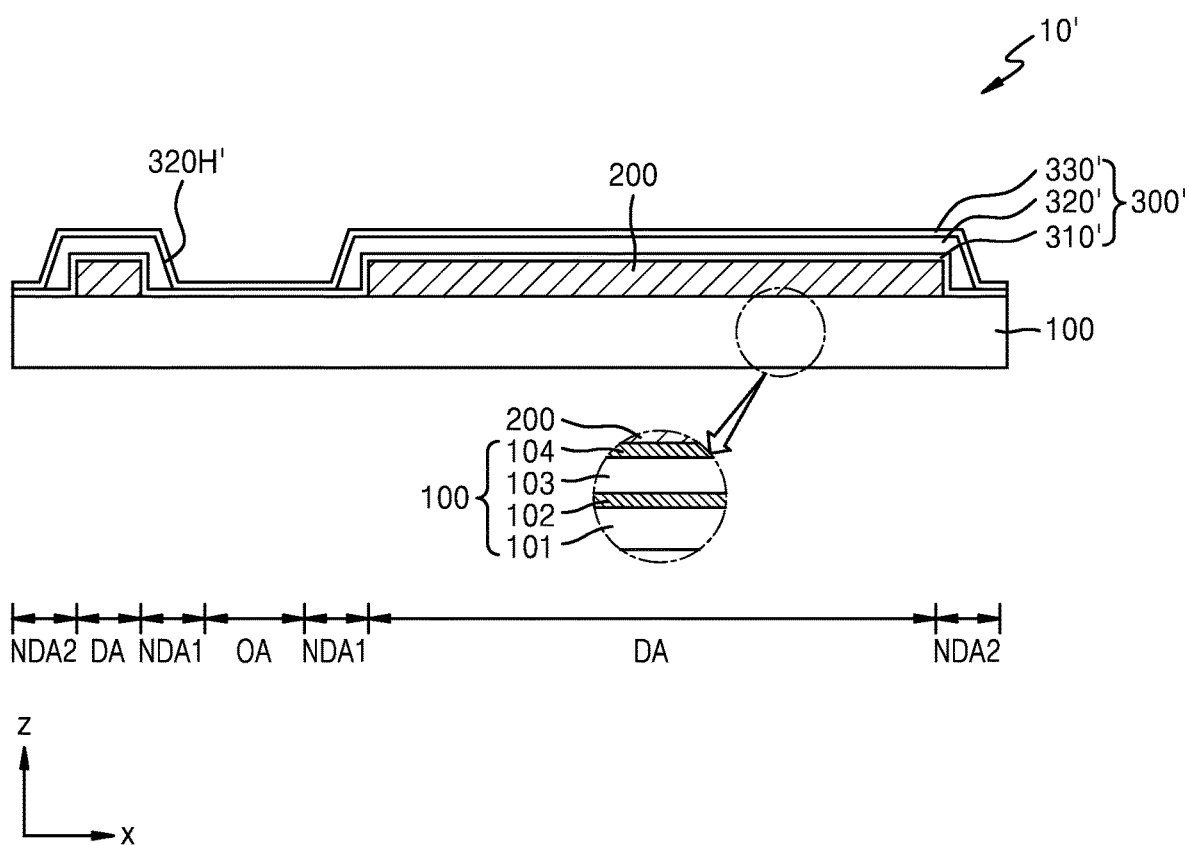
FIG. 4B is a cross-sectional views of a display panel according to an embodiment.
Figure 4C:
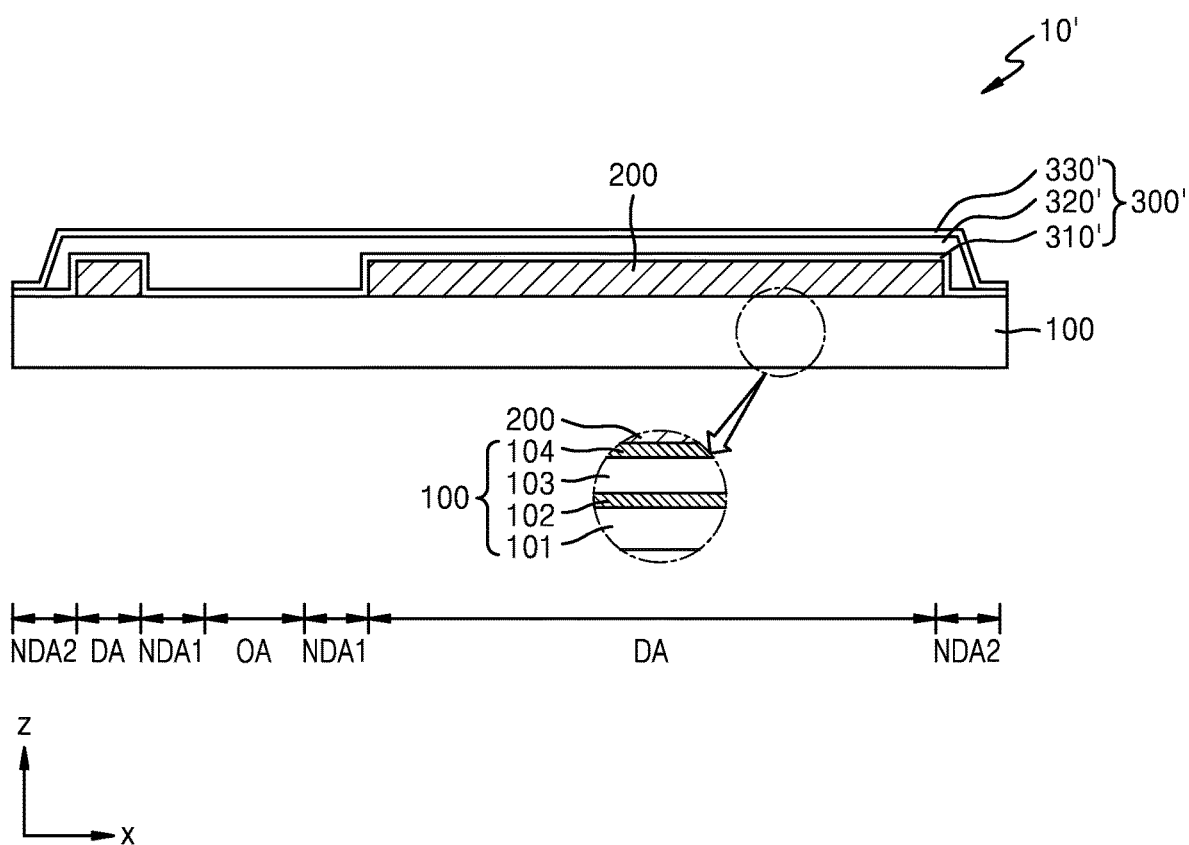
FIG. 4C is a cross-sectional views of a display panel according to an embodiment.

Each of FIGS. 4A to 4C shows a cross-sectional view of the display panel 10 according to an embodiment.

Referring to FIG. 4A, the display element layer 200 is arranged on the substrate 100. The display element layer 200 may be covered by a thin-film encapsulation member 300'. The encapsulation member 300' may include at least one inorganic encapsulation layer and at least one organic encapsulation layer. FIG. 4A shows a first inorganic encapsulation layer 310', a second inorganic encapsulation layer 330', and an organic encapsulation layer 320' between the layers 310' and 330'.

The inorganic encapsulation layers 310' and 330' may include one or more inorganic materials among aluminum oxide, titanium oxide, tantalum oxide, hafnium oxide, zinc oxide, silicon oxide, silicon nitride, and silicon oxynitride. The organic encapsulation layer 320' may include a polymer-based material. The polymer-based material may include at least one of an acrylic-based resin, an epoxy-based resin, polyimide, and polyethylene.

The substrate 100 may include a polymer resin and include a multi-layer structure. For example, the substrate 100 may include a first base layer 101, a first barrier layer 102, a second base layer 103, and a second barrier layer 104 that are sequentially stacked.

Each of the base layers 101 and 103 may include a polymer resin. For example, the base layers 101 and 103 may include a polymer resin such as at least one of polyethersulfone (PES), polyarylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (TAC), and cellulose acetate propionate (CAP). The polymer resin may be transparent.

Each of the barrier layers 102 and 104 may include a barrier layer configured to prevent penetration of external foreign substances and may include a single layer or a multi-layer structure including an inorganic material such as SiNx and/or SiOx.

The substrate 100 and the encapsulation member 300' may optimize the flexibility of the display panel 10'.

Referring to FIG. 4A, through holes 100H and 300H' respectively pass through the substrate 100 and the encapsulation member 300' and both correspond to the first opening 10H of the display panel 10' and the opening area OA. The display element layer 200 may also include a through hole corresponding to the opening area OA.

In another embodiment, as shown in FIG. 4B, an organic encapsulation layer 320' of the encapsulation member 300' includes a through hole 320H' corresponding to the opening area OA, but the substrate 100 and the inorganic encapsulation layers 310' and 330' may not respectively include through holes. In another embodiment, as shown in FIG. 4C, layers constituting the encapsulation member 300' may not include through holes corresponding to the opening area OA. That is, the inorganic encapsulation layers 310' and 330' and the organic encapsulation layer 320' may cover the opening area OA. In another embodiment, a component 20 (see FIG. 2) that does not require a high transmittance is arranged in the opening area OA. Even if the display element layer 200 does not include a through hole corresponding to the opening area OA, a portion of the display element layer 200 that corresponds to the opening area OA may provide sufficient transmittance.

Figure 5:
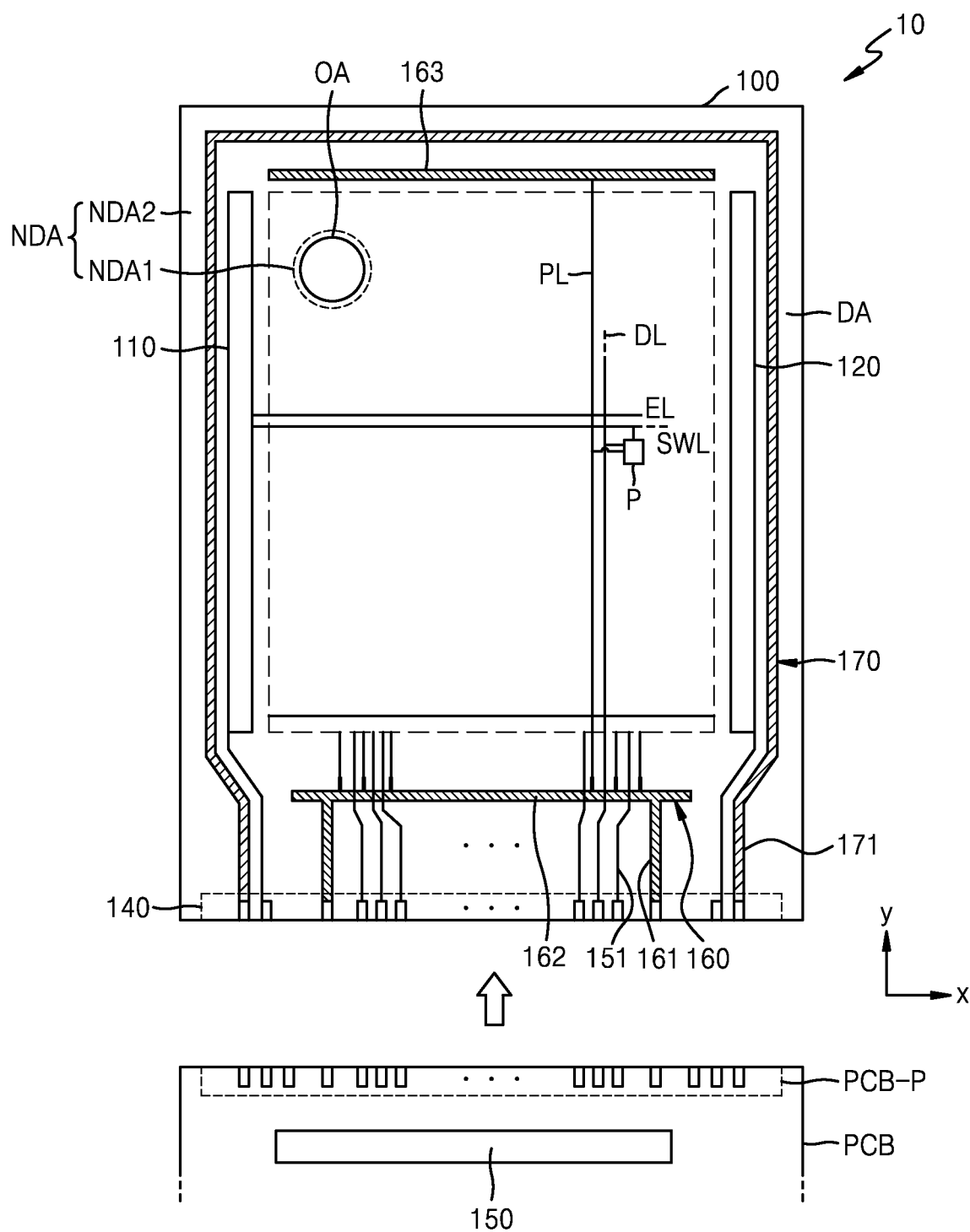
FIG. 5 is a plan view of a display panel according to an embodiment.

FIG. 5 is a plan view of the display panel 10 according to an embodiment.

Referring to FIG. 5, the display panel 10 includes the display area DA and the non-display areas NDA1 and NDA2. The substrate 100 may have areas OA, NDA1, and NDA2 respectively corresponding to the opening area OA, and the non-display areas NDA1 and NDA2 of the display panel 10.

The display panel 10 includes a plurality of pixels P arranged in the display area DA. Each of the pixels P may include a display element such as an organic light-emitting diode. Each pixel P may emit, for example, red, green, blue, or white light through the organic light-emitting diode. The opening area OA is arranged inside the display area DA, and the first non-display area NDA1 is located between the opening area OA and the display area DA.

The first non-display area NDA1 may surround the opening area OA. No display elements, e.g., no organic light-emitting diodes, are arranged in the first non-display area NDA1. Trace lines and/or power lines that provide signals to pixels P provided around the opening area OA may pass the first non-display area NDA1.

Each pixel P is electrically connected to outer circuits arranged in the second non-display area NDA2. A first outer driving circuit 110, a second outer driving circuit 120, a terminal 140, a data driving circuit 150, a first power supply line 160, and a second power supply line 170 may be arranged in the second non-display area NDA2.

The first outer driving circuit 110 may be a scan and control driving circuit and may provide a scan signal and an emission control signal to a pixel P through a scan line SWL and an emission control line EL. The second outer driving circuit 120 may also be a scan and control driving circuit and may be arranged opposite the first scan driving circuit 110. Like the first outer driving circuit 110, the second outer driving circuit 120 may provide a scan signal and an emission control signal to a pixel P through a scan line SWL and a emission control line EL.

The terminal 140 may be arranged on one side of the second non-display area NDA2. The terminal 140 may not be covered by an insulating layer and may be electrically connected to a printed circuit board PCB. A terminal PCB-P of the printed circuit board PCB may be electrically connected to the terminal 140 of the display panel 10. The printed circuit board PCB transfers a control signal or power to the display panel 10. Control signals generated by the controller may be transferred to the scan driving circuits 110 and 120 through the printed circuit board PCB. The controller may respectively provide powers ELVDD and ELVSS (see FIG. 6 below) to the power supply lines 160 and 170 through connection wirings 161 and 171. The first power ELVDD may be provided to each pixel P through a driving voltage line PL connected to the first power supply line 160, and the second power ELVSS (also referred to as a common voltage) may be provided to an opposite electrode of a pixel P connected to the second power supply line 170.

The data driving circuit 150 is electrically connected to the data line DL. A data signal of the data driving circuit 150 may be provided to a pixel P through a connection wiring 151 connected to the terminal 140 and a data line DL connected to the connection wiring 151. FIG. 5 shows that the data driving circuit 150 is arranged on the printed circuit board PCB. The data driving circuit 150 may be arranged on the substrate 100 in another embodiment. For example, the data driving circuit 150 may be arranged between the terminal 140 and the first power supply line 160.

The first power supply line 160 may include a first line 162 and a second line 163 extending in an x-direction at opposite sides of the display area DA. The second power supply line 170 may partially surround the display area DA and may have one open side.

Figure 6:
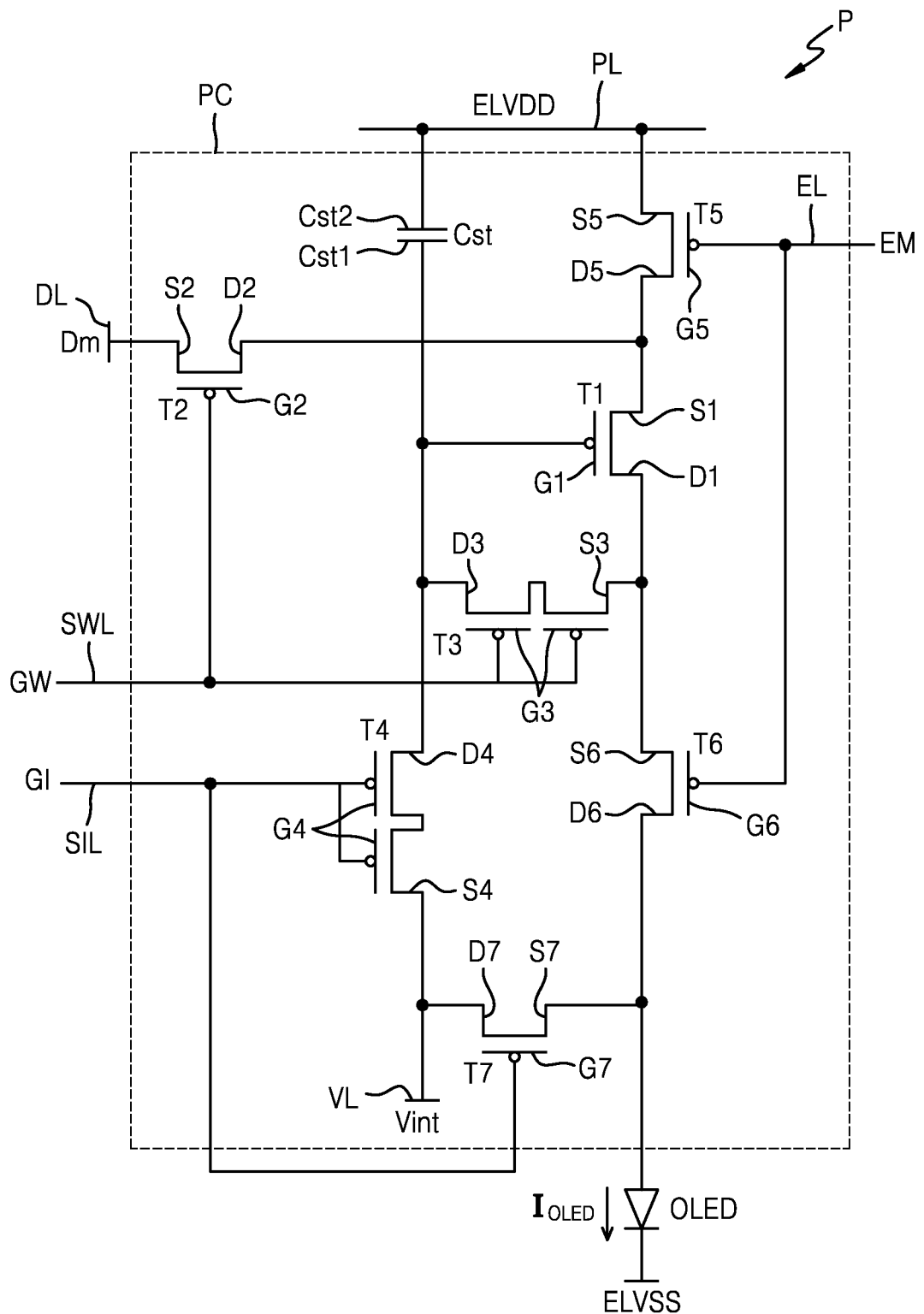
FIG. 6 is an equivalent circuit diagram of one of the pixels of a display panel according to an embodiment.

FIG. 6 is an equivalent circuit diagram of one of the pixels of the display panel 10 according to an embodiment.

Referring to FIG. 6, a pixel P includes the pixel circuit PC and an organic light-emitting diode OLED connected to the pixel circuit PC. The pixel circuit PC may include a plurality of thin film transistors and a storage capacitor Cst. The thin film transistors and the storage capacitor Cst may be connected to trace lines SWL, SIL, EL, and DL, an initialization voltage line VL, and the driving voltage line PL.

Though it is shown in FIG. 6 that each pixel P is connected to the trace lines SWL, SIL, EL, and DL, the initialization voltage line VL, and the driving voltage line PL, the present disclosure is not limited thereto. In another embodiment, at least one of the trace lines SWL, SIL, EL, and DL, the initialization voltage line VL, and the driving voltage line PL may be shared by neighboring pixels.

The plurality of thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The trace lines may include the scan line SWL configured to transfer a scan signal GW, the previous scan line SIL configured to transfer a previous scan signal GI to the first initialization thin film transistor T4 and the second initialization thin film transistor T7, an emission control line EL configured to transfer an emission control signal EM to the operation control thin film transistor T5 and the emission control thin film transistor T6, and the data line DL intersecting with the scan line SWL and configured to transfer a data signal Dm. The driving voltage line PL transfers the driving voltage ELVDD to the driving thin film transistor T1, and the initialization voltage line VL transfers an initialization voltage Vint that initializes the driving thin film transistor T1 and a pixel electrode.

A driving gate electrode G1 of the driving thin film transistor T1 is connected to a first storage capacitor plate Cst1 of the storage capacitor Cst, a driving source electrode S1 of the driving thin film transistor T1 is connected to the driving voltage line PL through the operation control thin film transistor T5, and a driving drain electrode D1 of the driving thin film transistor T1 is electrically connected with the pixel electrode of an organic light-emitting diode OLED through the emission control thin film transistor T6. The driving thin film transistor T1 receives a data signal Dm and supplies a driving current $I_{OLED}$ to the organic light-emitting diode OLED in response to a switching operation of the switching thin film transistor T2.

A switching gate electrode G2 of the switching thin film transistor T2 is connected to the scan line SWL, a switching source electrode S2 of the switching thin film transistor T2 is connected to the data line DL, and a switching drain electrode D2 of the switching thin film transistor T2 is connected to the driving source electrode S1 of the driving thin film transistor T1 and connected to the driving voltage line PL through the operation control thin film transistor T5. The switching thin film transistor T2 is turned on in response to a scan signal GW transferred through the scan line SWL and performs a switching operation of transferring a data signal Dm transferred through the data line DL to the driving source electrode S1 of the driving thin film transistor T1.

A compensation gate electrode G3 of the compensation thin film transistor T3 is connected to the scan line SWL, a compensation source electrode S3 of the compensation thin film transistor T3 is connected to the driving drain electrode D1 of the driving thin film transistor T1 and connected to the pixel electrode of the organic light-emitting diode OLED through the emission control thin film transistor T6, and a compensation drain electrode D3 of the compensation thin film transistor T3 is connected to the first storage capacitor plate Cst1 of the storage capacitor Cst, a first initialization drain electrode D4 of the first initialization thin film transistor T4, and the driving gate electrode G1 of the driving thin film transistor T1. The compensation thin film transistor T3 is turned on in response to a scan signal GW transferred through the scan line SWL and diode-connects the driving thin film transistor T1 by electrically connecting the driving gate electrode G1 with the driving drain electrode D1 of the driving thin film transistor T1.

A first initialization gate electrode G4 of the first initialization thin film transistor T4 is connected to the previous scan line SIL, a first initialization source electrode S4 of the first initialization thin film transistor T4 is connected to a second initialization drain electrode D7 of the second initialization thin film transistor T7 and the initialization voltage line VL, and a first initialization drain electrode D4 of the first initialization thin film transistor T4 is connected to the first storage capacitor plate Cst1 of the storage capacitor Cst, the compensation drain electrode D3 of the compensation thin film transistor T3, and the driving gate electrode G1 of the driving thin film transistor T1. The first initialization thin film transistor T4 is turned on in response to a previous scan signal GI transferred through the previous scan line SIL and performs an initialization operation of initializing a voltage of the driving gate electrode G1 of the driving thin film transistor T1 by transferring the initialization voltage Vint to the driving gate electrode G1 of the driving thin film transistor T1.

An operation control gate electrode G5 of the operation control thin film transistor T5 is connected to the emission control line EL, an operation control source electrode S5 of the operation control thin film transistor T5 is connected to the driving voltage line PL, and an operation control drain electrode D5 of the operation control thin film transistor T5 is connected to the driving source electrode S1 of the driving thin film transistor T1 and the switching drain electrode D2 of the switching thin film transistor T2.

An emission control gate electrode G6 of the emission control thin film transistor T6 is connected to the emission control line EL, an emission control source electrode S6 of the emission control thin film transistor T6 is connected to the driving drain electrode D1 of the driving thin film transistor T1 and the compensation source electrode S3 of the compensation thin film transistor T3, and an emission control drain electrode D6 of the emission control thin film transistor T6 is electrically connected to a second initialization source electrode S7 of the second initialization thin film transistor T7 and the pixel electrode of the organic light-emitting diode OLED.

The operation control thin film transistor T5 and the emission control thin film transistor T6 are simultaneously turned on in response to an emission control signal EM transferred through the emission control line EL to allow the driving voltage ELVDD to be transferred to the organic light-emitting diode OLED and allow the driving current $I_{OLED}$ to flow through the organic light-emitting diode OLED.

A second initialization gate electrode G7 of the second initialization thin film transistor T7 is connected to the previous scan line SIL, a second initialization source electrode S7 of the second initialization thin film transistor T7 is connected to the emission control drain electrode D6 of the emission control thin film transistor T6 and the pixel electrode of the organic light-emitting diode OLED, and a second initialization drain electrode D7 of the second initialization thin film transistor T7 is connected to the first initialization source electrode S4 of the first initialization thin film transistor T4 and the initialization voltage line VL. The second initialization thin film transistor T7 is turned on in response to a previous scan signal GI transferred through the previous scan line SIL to initialize the pixel electrode of the organic light-emitting diode OLED.

Though it is shown in FIG. 6 that the first initialization thin film transistor T4 and the second initialization thin film transistor T7 are connected to the previous scan line SIL, the present disclosure is not limited thereto. In another embodiment, the first initialization thin film transistor T4 may be connected to the previous scan line SIL and driven in response to a previous scan signal GI, and the second initialization thin film transistor T7 may be connected to a separate trace line (e.g. the next scan line) and driven in response to a signal transferred through the trace line.

A second storage capacitor plate Cst2 of the storage capacitor Cst is connected to the driving voltage line PL, and the opposite electrode of the organic light-emitting diode OLED is connected to a common voltage ELVSS. Accordingly, the organic light-emitting diode OLED may display an image by receiving the driving current $I_{OLED}$ from the driving thin film transistor T1 and emitting light.

Though it is shown in FIG. 6 that each of the compensation thin film transistor T3 and the initialization thin film transistor T4 includes a dual gate electrode, each of the compensation thin film transistor T3 and the initialization thin film transistor T4 may include one gate electrode.

FIG. 6 shows that the pixel circuit PC includes seven thin film transistors and one storage capacitor. The number of thin film transistors and the number of storage capacitors may be six or less or eight or less and may be configured depending on embodiments.

Figure 7A:
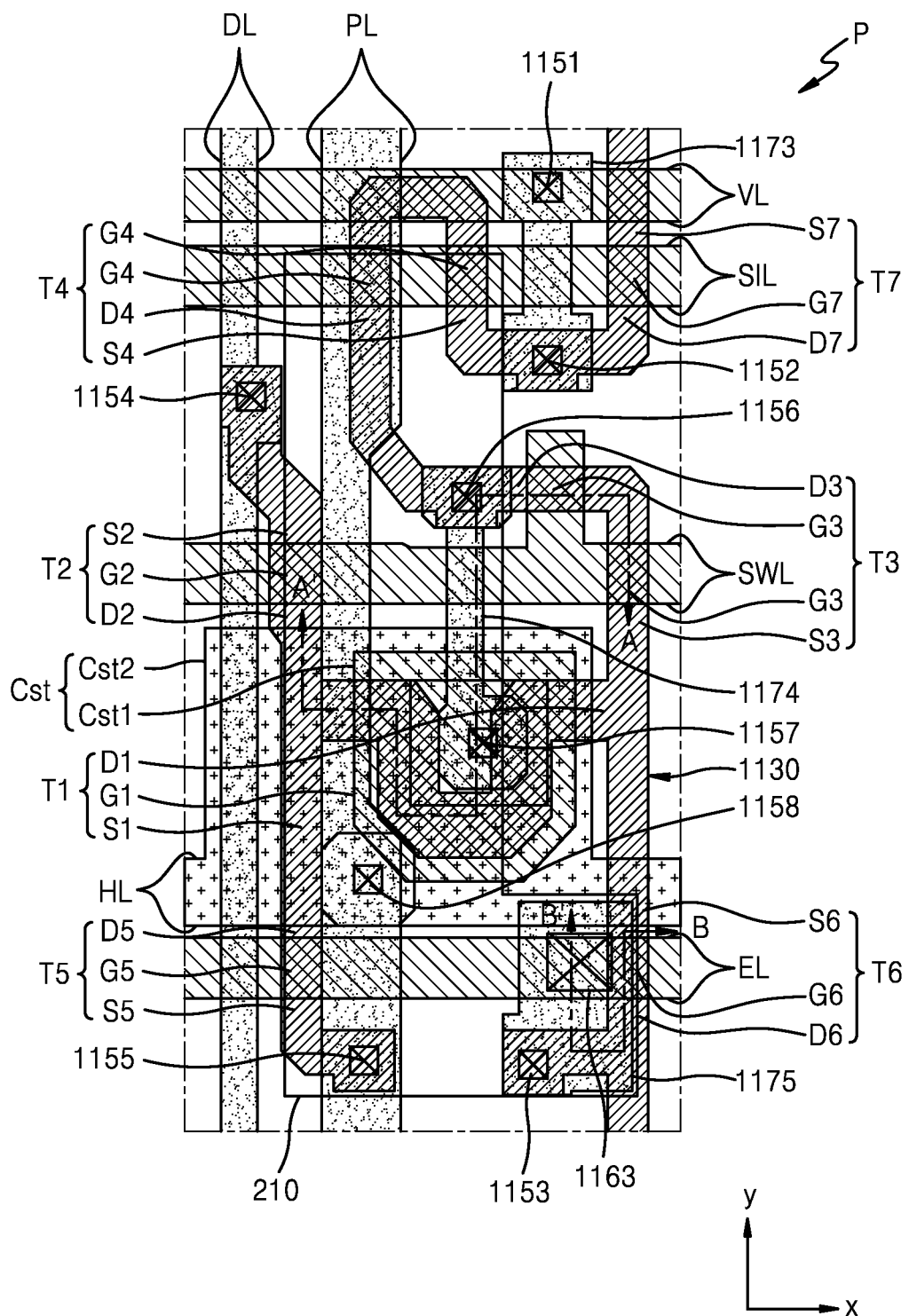
FIG. 7A is a plan view of one of the pixels of a display panel according to an embodiment.
Figure 7B:
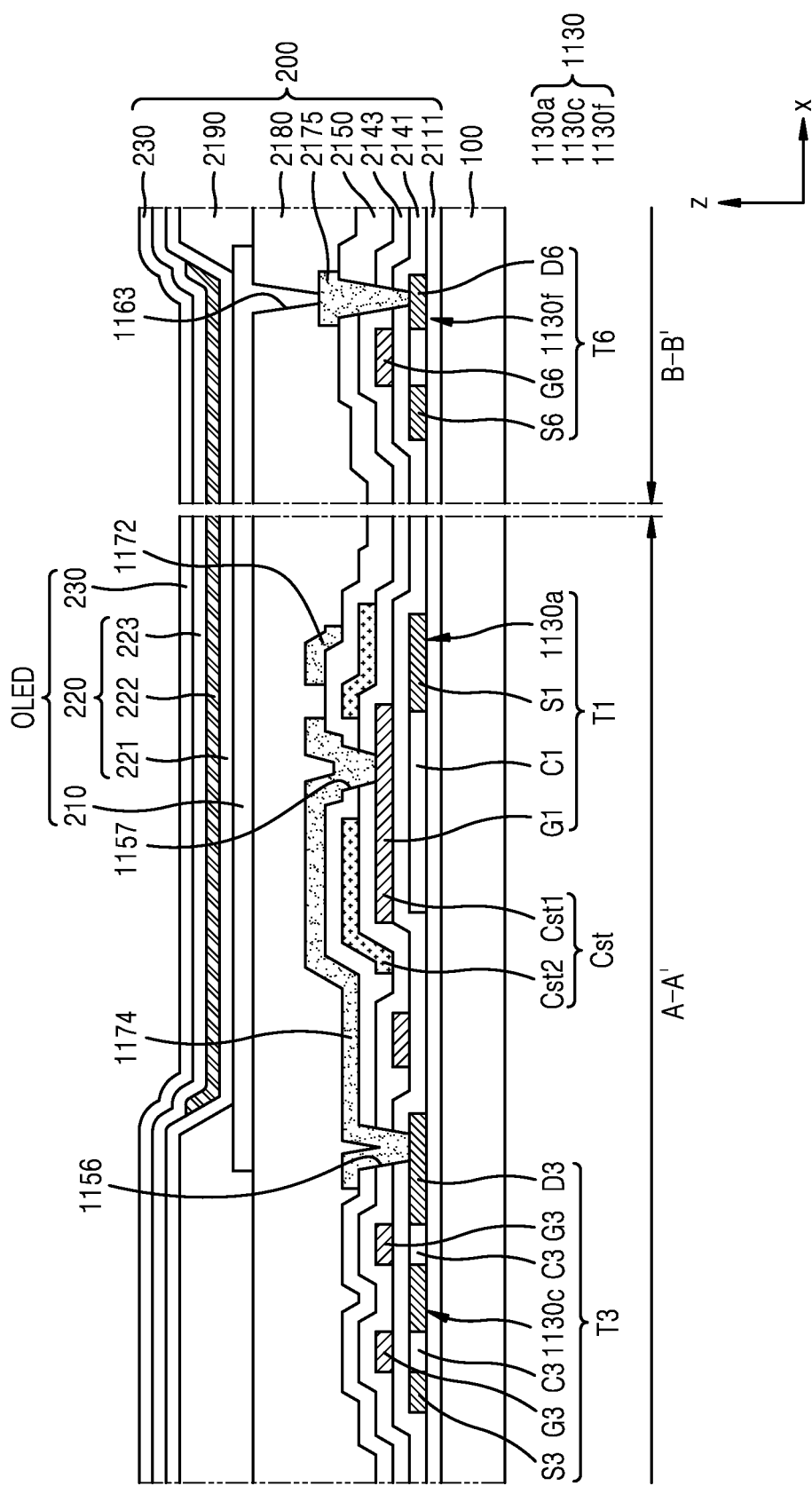
FIG. 7B is a cross-sectional view taken along lines A-A' and B-B' of FIG. 7A.

FIG. 7A is a plan view of one of the pixels of the display panel 10 according to an embodiment, and FIG. 7B is a cross-sectional view taken along lines A-A' and B-B' of FIG. 7A.

Referring to FIGS. 7A and 7B, the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 are arranged along a semiconductor layer 1130. As shown in FIG. 7B, the semiconductor layer 1130 is located over the substrate 100, and a buffer layer 2111 including an inorganic material such as silicon oxide, silicon nitride, and silicon oxynitride is formed under the semiconductor layer 1130.

Some areas of the semiconductor layer 1130 correspond to semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7. In other words, it may be understood that the semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 are connected to each other and bent in various shapes. FIG. 7B shows a driving semiconductor layer 1130a of the driving thin film transistor T1, a compensation semiconductor layer 1130c of the compensation thin film transistor T3, and an emission control semiconductor layer 1130f of the emission control thin film transistor T6 respectively corresponding to some areas of the semiconductor layer 1130.

The semiconductor layer 1130 includes a channel region, and a source region and a drain region respectively on two opposite sides of the channel region. The source region and the drain region may be understood as a source electrode and a drain electrode of a relevant thin film transistor. Hereinafter, for convenience of description, the source region and the drain region are respectively referred to as the source electrode and the drain electrode.

The driving thin film transistor T1 includes the driving gate electrode G1 overlapping a driving channel region and the driving source electrode S1 and the driving drain electrode D1 respectively on two opposite sides of the driving channel region. The driving channel region overlapping the driving gate electrode G1 may form a long channel length inside a narrow space by having a bent shape such as an omega shape. In the case where the length of the driving channel region is long, a driving range of a gate voltage is widened and thus a gray scale of light emitted from an organic light-emitting diode OLED may be more elaborately controlled and thus display quality may be improved.

The switching thin film transistor T2 includes the switching gate electrode G2 overlapping a switching channel region and the switching source electrode S2 and the switching drain electrode D2 respectively on two opposite sides of the switching channel region. The switching drain electrode D2 may be connected to the driving source electrode S1.

The compensation thin film transistor T3 is a dual thin film transistor and may include the compensation gate electrodes G3 overlapping two compensation channel regions and include the compensation source electrode S3 and the compensation drain electrode D3 respectively on two opposite sides of the compensation channel region. The compensation thin film transistor T3 may be connected to the driving gate electrode G1 of the driving thin film transistor T1 through a node connection line 1174 which will be described below.

The first initialization thin film transistor T4 is a dual thin film transistor and may include the first initialization gate electrodes G4 overlapping two first initialization channel regions and include the first initialization source electrode S4 and the first initialization drain electrode D4 respectively on two opposite sides of the first initialization channel region.

The operation control thin film transistor T5 may include the operation control gate electrode G5 overlapping an operation control channel region and the operation control source electrode S5 and the operation control drain electrode D5 respectively on two opposite sides of the operation control channel region. The operation control drain electrode D5 may be connected to the driving source electrode S1.

The emission control thin film transistor T6 may include the emission control gate electrode G6 overlapping an emission control channel region and the source electrode S6 and the emission control drain electrode D6 respectively on two opposite sides of the emission control channel region. The emission control source electrode S6 may be connected to the driving drain electrode D1.

The second initialization thin film transistor T7 may include the second initialization gate electrode G7 overlapping a second initialization channel region and the second initialization source electrode S7 and the second initialization drain electrode D7 respectively on two opposite sides of the second initialization channel region.

The above-described thin film transistors may be connected to the trace lines SWL, SIL, EL, and DL, the initialization voltage line VL, and the driving voltage line PL.

A gate insulating layer 2141 (see FIG. 7B) may be arranged on the semiconductor layer 1130. The scan line SWL, the previous scan line SIL, the emission control line EL, the driving gate electrode G1, and the initialization voltage line VL may be arranged on the gate insulating layer 2141. The gate insulating layer 2141 may include an inorganic material such as silicon oxide, silicon nitride, and silicon oxynitride. The scan line SWL, the previous scan line SIL, the emission control line EL, the driving gate electrode G1, and the initialization voltage line VL may include metal such as Mo, Al, Cu, Ti, and an alloy.

The scan line SWL may extend in the x-direction. Some areas of the scan line SWL may respectively correspond to the switching and compensation gate electrodes G2 and G3. For example, areas of the scan line SWL that overlap the channel regions of the switching and compensation thin film transistors T2 and T3 may be the switching and compensation gate electrodes G2 and G3, respectively.

The previous scan line SIL may extend in the x-direction. Some areas of the previous scan line SIL may respectively correspond to the initialization gate electrodes G4 and G7. For example, areas of the previous scan line SIL that overlap the channel regions respectively of the initialization thin film transistors T4 and T7 may be the initialization gate electrodes G4 and G7, respectively.

The emission control line EL may extend in the x-direction. Some areas of the emission control line EL may respectively correspond to the operation control and emission control gate electrodes G5 and G6. For example, areas of the emission control line EL that overlap the channel regions respectively of the operation control and emission control thin film transistors T5 and T6 may be the operation control and emission control gate electrodes G5 and G6, respectively.

The driving gate electrode G1 is a floating electrode and may be connected to the compensation thin film transistor T3 through the node connection line 1174.

The initialization voltage line VL may extend in the x-direction. The initialization voltage line VL may be connected to the initialization thin film transistors T4 and T7 through an initialization connection line 1173 which will be described below.

Though it is described in FIG. 7A that the initialization voltage line VL is arranged on the gate insulating layer 2141, the initialization voltage line VL may be arranged on a planarization insulating layer 2180 (see FIG. 7B), which will be described below, and may include the same material as that of the pixel electrode 210 in another embodiment.

An electrode voltage line HL may be arranged over the scan line SWL, the previous scan line SIL, the emission control line EL, the driving gate electrode G1, and the initialization voltage line VL with an intervening first interlayer insulating layer 2143 (see FIG. 7B) including an inorganic material.

As shown in FIG. 7A, the electrode voltage line HL may extend in the x-direction and may intersect with the data line DL and the driving voltage line PL. A portion of the electrode voltage line HL may cover at least a portion of the driving gate electrode G1 and may constitute the storage capacitor Cst in cooperation with the driving gate electrode G1. For example, the driving gate electrode G1 may serve as the first storage capacitor plate Cst1 of the storage capacitor Cst, and a portion of the electrode voltage line HL may serve as the second storage capacitor plate Cst2 of the storage capacitor Cst.

The electro voltage line HL and the second storage capacitor plate Cst2 are electrically connected to the driving voltage line PL. With regard to this, it is shown in FIG. 7A that the electrode voltage line HL is connected to the driving voltage line PL arranged on the electrode voltage line HL through a contact hole 1158. The electrode voltage line HL may have the same voltage level (a constant voltage, e.g. +5V) as that of the driving voltage line PL. The electrode voltage line HL may be understood as a kind of a transverse direction driving voltage line.

Since the driving voltage line PL extends in a y-direction and the electrode voltage line HL electrically connected to the driving voltage line PL extends in the x-direction different from the y-direction, a plurality of driving voltage lines PL and a plurality of electrode voltage lines HL may constitute a mesh structure in the display area DA.

The data line DL, the driving voltage line PL, the initialization connection line 1173, and the node connection line 1174 may be arranged on the second storage capacitor plate Cst2 and the electrode voltage line HL with an intervening second interlayer insulating layer 2150 (see FIG. 7B) including an inorganic material. The data line DL, the driving voltage line PL, the initialization connection line 1173, and the node connection line 1174 may include at least one of Al, Cu, Ti, Mo, and TiN and may include a single layer or a multi-layer. In an embodiment, the driving voltage line PL and the data line DL may have a multi-layered structure including Ti/Al/Ti.

The data line DL may extend in the y-direction and may be connected to the switching source electrode S2 of the switching thin film transistor T2 through a contact hole 1154. A portion of the data line DL may be understood as the switching source electrode S2.

The driving voltage line PL may extend in the y-direction and may be connected to the electrode voltage line HL through the contact hole 1158. Also, the driving voltage line PL may be connected to the operation control thin film transistor T5 through a contact hole 1155. The driving voltage line PL may be connected to the operation control source electrode S5 through the contact hole 1155.

One end of the initialization connection line 1173 may be connected to the initialization thin film transistors T4 and T7 through a contact hole 1152, and the other end of the initialization connection line 1173 may be connected to the initialization voltage line VL through a contact hole 1151.

One end of the node connection line 1174 may be connected to the compensation drain electrode D3 through a contact hole 1156, and the other end of the node connection line 1174 may be connected to the driving gate electrode G1 through a contact hole 1157.

The planarization insulating layer 2180 including an organic insulating material is located on the data line DL, the driving voltage line PL, the initialization connection line 1173, and the node connection line 1174. The pixel electrode 210 is arranged on the planarization insulating layer 2180.

Referring to FIG. 7, edges of the pixel electrode 210 are covered by a pixel-defining layer 2190 on the planarization insulating layer 2180. A central region of the pixel electrode 210 may be exposed through an opening of the pixel-defining layer 2190. The pixel electrode 210 may include a reflective layer including Ag, Mg, Al, Pt, Pd, Au, Ni, Nd, Ir, Cr, or a compound. In another embodiment, the pixel electrode 210 may further include a layer including indium tin oxide (ITO), zinc oxide (IZO), zinc oxide (ZnO), and/or indium oxide ($In_2O_3$) on/under the reflective layer. An intermediate layer 220 is arranged on a portion of the pixel electrode 210 exposed through the opening.

The intermediate layer 220 includes an emission layer 222 on a portion of the pixel electrode 210 exposed through the opening of the pixel-defining layer 2190. The emission layer 222 may include a polymer or low molecular organic material that emits light of a predetermined color. In an embodiment, as shown in FIG. 7B, the intermediate layer 220 may include a first functional layer 221 under the emission layer 222 and/or a second functional layer 223 on the emission layer 222.

The first functional layer 221 may include a single layer or a multi-layer. For example, in the case where the first functional layer 221 includes a polymer material, the first functional layer 221 may include a hole transport layer (HTL), which has a single-layered structure, and may include poly-(3,4)-ethylene-dihydroxy thiophene (PEDOT) or polyaniline (PANI). In the case where the first functional layer 221 includes a low molecular weight material, the first functional layer 221 may include a hole injection layer (HIL) and an HTL.

The second functional layer 223 may be omitted. For example, in the case where the first functional layer 221 and the emission layer 222 include a polymer material, it is preferable that the second functional layer 223 is provided to make a characteristic of the organic light-emitting diode OLED excellent. The second functional layer 223 may be a single layer or a multi-layer. The second functional layer 223 may include an electron transport layer (ETL) and/or an electron injection layer (EIL).

An opposite electrode 230 may overlap the pixel electrode 210 with the intervening intermediate layer 220. The opposite electrode 230 may include a conductive material having a low work function. For example, the opposite electrode 230 may include a semi-transparent or transparent layer including Ag, Mg, Al, Pt, Pd, Au, Ni, Nd, Ir, Cr, Li, Ca, or an alloy. The opposite electrode 230 may further include a layer including ITO, IZO, ZnO, or $In_2O_3$.

Though not shown in FIG. 7B, the display element layer 200 may be covered by an encapsulation member described above with reference to one of FIGS. 3A to 4C.

Figure 8:
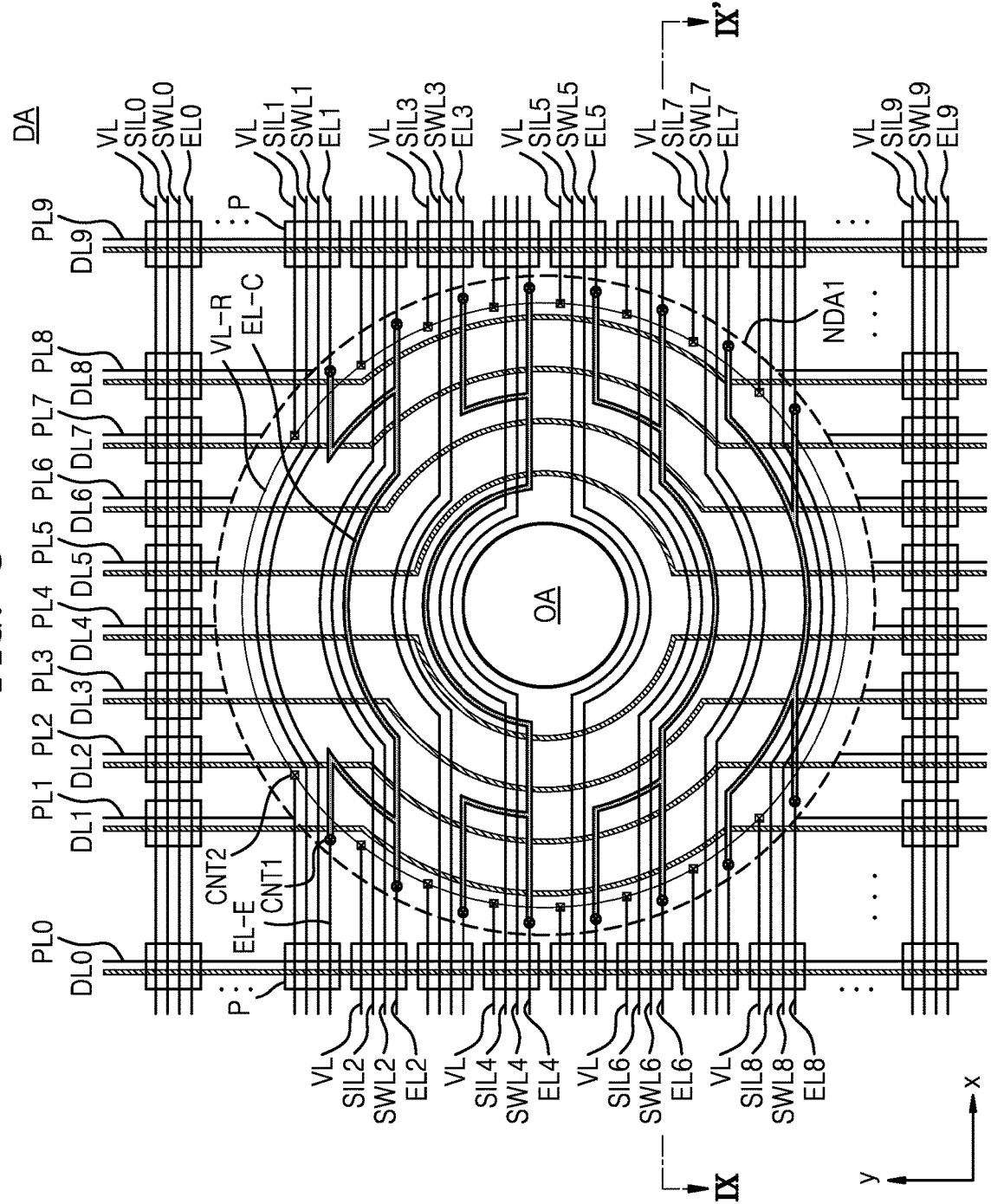
FIG. 8 is a plan view of lines around an opening area of a display panel according to an embodiment.
Figure 9A:
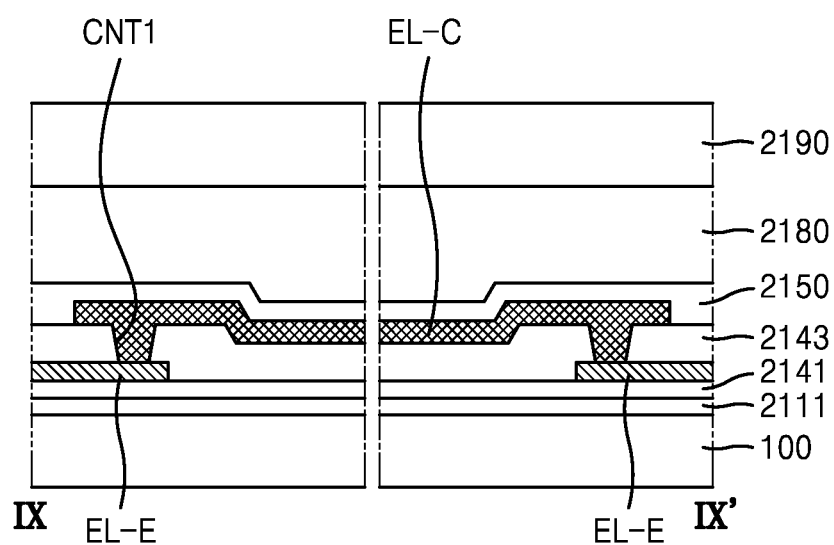
FIG. 9A is a cross-sectional view of an emission control line taken along line IX-IX' of FIG. 8 according to an embodiment.
Figure 9B:
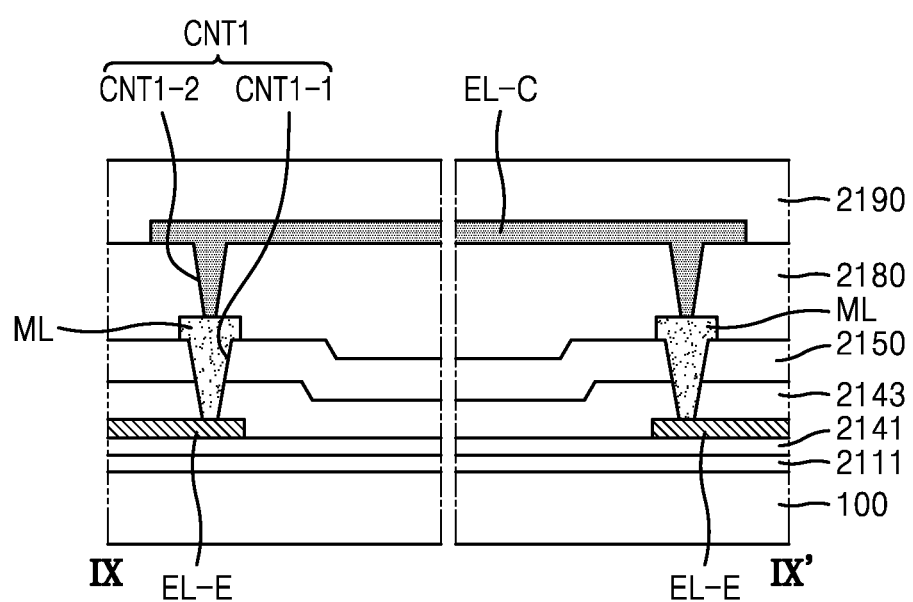
FIG. 9B is a cross-sectional view of an emission control line taken along line IX-IX' of FIG. 8 according to an embodiment.
Figure 10:
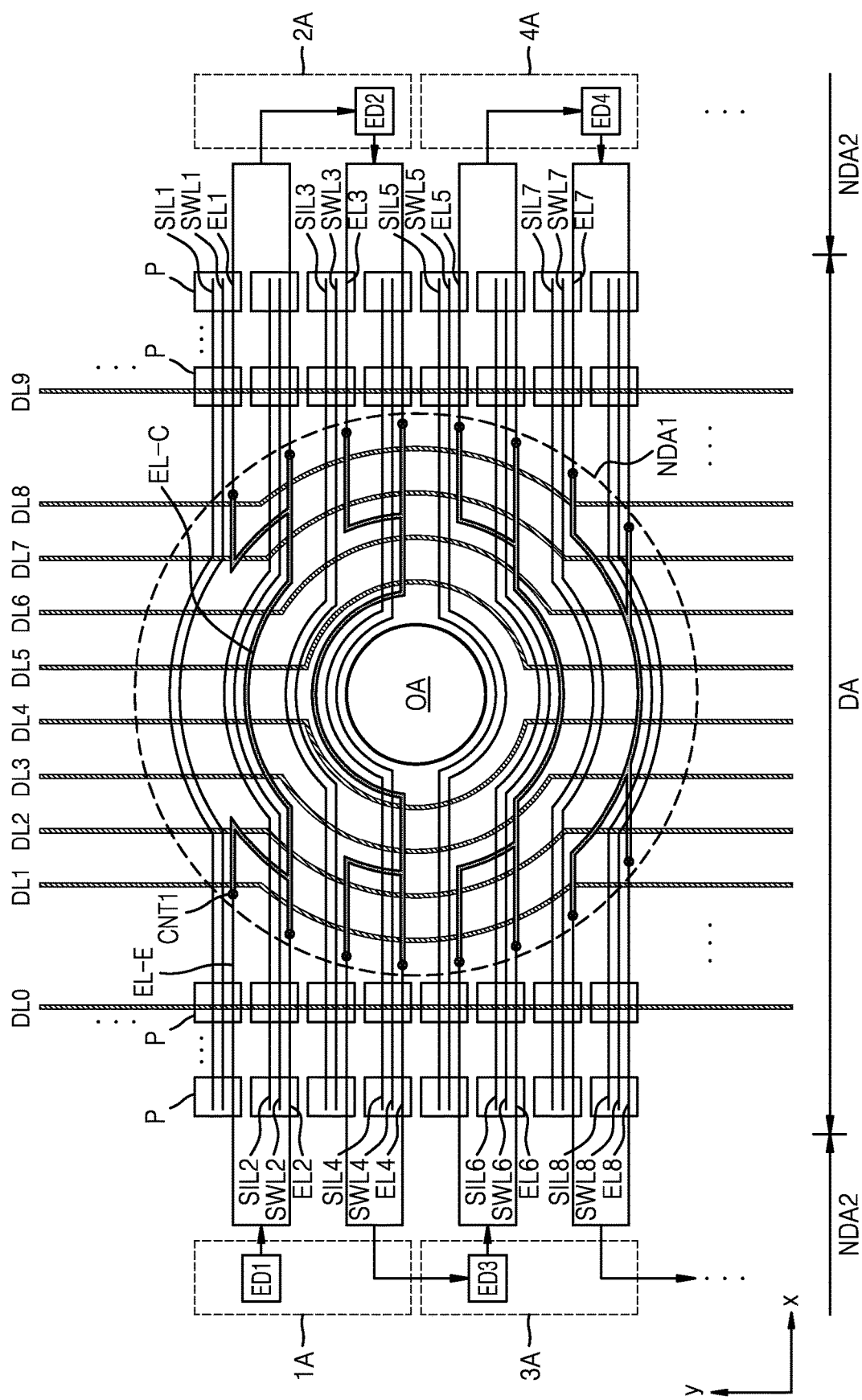
FIG. 10 is a plan view of at least an emission control line and an emission control driver of a display panel according to an embodiment.

FIG. 8 is a plan view of lines around the opening area OA in the display panel 10 according to an embodiment, FIGS. 9A and 9B are cross-sectional views of an emission control line taken along line IX-IX' of FIG. 8 according to embodiments, and FIG. 10 is a plan view of at least an emission control line and an emission control driver of the display panel 10 according to an embodiment.

Though FIGS. 8 and 10 show that eight pixels are arranged at each of four sides relative to the opening area OA for convenience of description, more pixels and more lines may be arranged.

Referring to FIG. 8, data lines DL0, DL1, DL2, DL3, DL4, DL5, DL6, DL7, DL8, and DL9 and driving voltage lines PL0, PL1, PL2, PL3, PL4, PL5, PL6, PL7, PL8, and PL9 may substantially extend in the y-direction. Portions of the driving voltage lines PL1, PL2, PL3, PL4, PL5, PL6, PL7, and PL8 above and below the opening area OA among the driving voltage lines PL0, PL1, PL2, PL3, PL4, PL5, PL6, PL7, PL8, and PL9 in FIG. 8 may be disconnected around the opening area OA. Portions of the driving voltage lines PL1, PL2, PL3, PL4, PL5, PL6, PL7, and PL8 located above the opening area OA may be connected to the second line 163 described with reference to FIG. 5, and portions of the driving voltage lines PL1, PL2, PL3, PL4, PL5, PL6, PL7, and PL8 located below the opening area OA may be connected to the first line 162.

Each initialization voltage line VL may transfer an initialization voltage to a pixel P and may extend in the x-direction in the display area DA. Sections of the initialization voltage lines VL t arranged at the left and right relative to the opening area OA may be disconnected around the opening area OA. The initialization voltage lines VL that are disconnected around the opening area OA may be connected to an electrode layer VL-R arranged in the first non-display area NDA1 through a second contact hole CNT2. The electrode layer VL-R may have a ring shape surrounding the opening area OA.

Referring to FIGS. 7A and 7B, the initialization voltage line VL may be arranged on the first interlayer insulating layer 2143, and the electrode layer VL-R may be arranged on the planarization insulating layer 2180. The electrode layer VL-R may be connected to the initialization voltage lines VL through the second contact hole CNT2.

Some of the data lines, for example, the data lines DL1, DL2, DL3, DL4, DL5, DL6, DL7, and DL8 may detour around an edge of the opening area OA in the first non-display area NDA1. Each of the data lines DL1, DL2, DL3, DL4, DL5, DL6, DL7, and DL8 may be electrically connected to pixels P arranged above and below the opening area OA, may include a portion extending in the y-direction in the display area DA, and may include a portion that detours around the edge of the opening area OA in the first non-display area NDA1. Though FIG. 8 shows that the detouring portion of the data line DL is an arc-shaped curve, the detouring portion may be a line bent in zigzag. Likewise, though it is shown in FIG. 8 that a detouring portion of each of the other lines is an arc-shaped curve, the detouring portion may be a line bent in zigzags.

In FIG. 8, the pixels P located above and below the opening area OA are electrically connected to the data lines DL1, DL2, DL3, DL4, DL5, DL6, DL7, and DL8 that detour around the opening area OA and may receive a data signal through the connected data line. The data lines DL1, DL2, DL3, and DL4 may detour around the opening area OA on a first side (e.g. a left side) of the opening area OA, and the data lines DL5, DL6, DL7, and DL8 may detour around the opening area OA on a second side (e.g. a right side) of the opening area OA.

Scan lines SWL0, SWL1, SWL2, SWL3, SWL4, SWL5, SWL6, SWL7, SWL8, and SWL9 and previous scan lines SIL0, SIL1, SIL2, SIL3, SIL4, SIL5, SIL6, SIL7, SIL8, and SIL9 may substantially extend in the x-direction different from the y-direction. Some of the scan lines, for example, the scan lines SWL1, SWL2, SWL3, SWL4, SWL5, SWL6, SWL7, and SWL8 may detour around the opening area OA. Also, some of the previous scan lines SIL0, SIL1, SIL2, SIL3, SIL4, SIL5, SIL6, SIL7, SIL8, and SIL9, for example, the previous scan lines SIL1, SIL2, SIL3, SIL4, SIL5, SIL6, SIL7, and SIL8 may detour around the opening area OA. For example, the scan lines SWL1, SWL2, SWL3, and SWL4 and the previous scan lines SIL1, SIL2, SIL3, and SIL4 may detour around the opening area OA on a third side (e.g. an upper side) of the opening area OA, and the scan lines SWL5, SWL6, SWL7, and SWL8 and the previous scan lines SIL5, SIL6, SIL7, and SIL8 may detour around the opening area OA on a fourth side (e.g. a lower side) of the opening area OA.

The scan lines SWL1, SWL2, SWL3, SWL4, SWL5, SWL6, SWL7, and SWL8 and the previous scan lines SIL1, SIL2, SIL3, SIL4, SIL5, SIL6, SIL7, and SIL8 may be located on the gate insulating layer 2141 (described with reference to FIGS. 7A and 7B) in the display area DA and may detour around the opening area OA on the gate insulating layer 2141 in the first non-display area NDA1.

Emission control lines EL0, EL1, EL2, EL3, EL4, EL5, EL6, EL7, EL8, and EL9 may substantially extend in the x-direction. Some of the emission control lines, for example, the emission control lines EL1, EL2, EL3, EL4, EL5, EL6, EL7, and EL8 may detour around the opening area OA. For example, the emission control lines EL1, EL2, EL3, and EL4 may detour around the opening area OA on an upper side of the opening area OA, and the emission control lines EL5, EL6, EL7, and EL8 may detour around the opening area OA on a lower side of the opening area OA.

In the first non-display area NDA1, an emission control line of one of two immediately adjacent pixels may be connected to an emission control line of another pixel. For example, a first emission control line EL1 on a first pixel row that transfers an emission control signal to pixels P of the first pixel row arranged on the left and right of the opening area OA may be connected to a second emission control line EL2 on a second pixel row in the first non-display area NDA1. For example, in the first non-display area NDA1, the first emission control line EL1 may be connected to a detour line EL-C of the second emission control line EL2. If the emission control lines EL1 and EL2 are not connected to each other and respectively have detour lines EL-C, the number of emission control lines that pass the first non-display area NDA1 may be undesirably large. In an embodiment, since the first emission control line EL1 is connected to the detour line EL-C of the second emission control line EL2 in the first non-display area NDA1, in other words, since the first emission control line EL1 and the second emission control line EL2 share the detour line EL-C, the number of detour lines of the emission control lines that pass the first non-display area NDA1 may be advantageously minimized.

Likewise, a third emission control line EL3 on a third row may be connected to a fourth emission control line EL4 on a fourth row in the first non-display area NDA1, a fifth emission control line EL5 on a fifth row may be connected to a sixth emission control line EL6 on a sixth row in the first non-display area NDA1, and a seventh emission control line EL7 on a seventh row may be connected to an eighth emission control line EL8 on an eighth row in the first non-display area NDA1.

Extension portions EL-E and the detour lines EL-C of the emission control lines EL1, EL2, EL3, EL4, EL5, EL6, EL7, and EL8 may be located on different layers. Each of FIGS. 9A and 9B shows a cross-section of an emission control line taken along line IX-IX' according to an embodiment.

Referring to FIG. 9A, the extension portion EL-E of the sixth emission control line EL6 may be located on the gate insulating layer 2141, and the detour line EL-C of the sixth emission control line EL6 may be located on the first interlayer insulating layer 2143. The extension portion EL-E and the detour line EL-C of the sixth emission control line EL6 may be electrically connected to each other through a first contact hole CNT1.

Referring to FIG. 9B, the extension portion EL-E of the sixth emission control line EL6 may be located on the gate insulating layer 2141, and the detour line EL-C of the sixth emission control line EL6 may be located on the planarization insulating layer 2180. The extension portion EL-E and the detour line EL-C of the sixth emission control line EL6 may be electrically connected to each other through the first contact hole CNT1, and mediation metals ML may be located between the elements EL-E and EL-C.

The mediation metals ML may be located on the second interlayer insulating layer 2150. The mediation metals ML may be respectively connected to the extension portions EL-E through contact holes CNT1-1 of the interlayer insulating layers 2143 and 2150, and the detouring portion EL-C may be connected to the mediation metals ML through contact holes CNT1-2. The mediation metals ML may include metal members arranged in only an area corresponding to the first contact holes CNT1 and may include the same material as that of the data lines. The detouring portion EL-C on the planarization insulating layer 2180 may include the same material as that of the pixel electrode 210 described with reference to FIG. 7B.

Referring to FIG. 10, emission control drivers ED1, ED2, ED3, and ED4 may be arranged in the second non-display area NDA2 and may be arranged on two opposite sides of the display area DA.

The first emission control driver ED1 arranged on the left of the second non-display area NDA2 simultaneously provides emission control signals to the emission control lines EL1 and EL2, and the signals may be provided to pixels P arranged on the left and right of the opening area OA through the extension portions EL-E and the detour lines EL-C of the emission control lines EL1 and EL2.

An emission control signal provided by the first emission control driver ED1 is transferred, as a carry signal, to the second emission control driver ED2 arranged on the right of the second non-display area NDA2. The second emission control driver ED2 simultaneously provides emission control signals to the emission control lines EL3 and EL4, and the signals may be provided to pixels P arranged on the left and right of the opening area OA through the extension portions EL-E and the detour lines EL-C of the emission control lines EL3 and EL4.

An emission control signal transferred by the second emission control driver ED2 is transferred, as a carry signal, to the third emission control driver ED3 arranged on the left of the second non-display area NDA2. The third emission control driver ED3 simultaneously provides emission control signals to the emission control lines EL5 and EL6, and the signals may be provided to pixels P arranged on the left and right of the opening area OA through the extension portions EL-E and the detour lines EL-C of the emission control lines EL5 and EL6.

An emission control signal transferred by the third emission control driver ED3 is transferred, as a carry signal, to the fourth emission control driver ED4 arranged on the left of the second non-display area NDA2. The fourth emission control driver ED4 simultaneously provides emission control signals to the emission control lines EL7 and EL8, and the signals may be provided to pixels P arranged on the left and right of the opening area OA through the extension portions EL-E and the detour lines EL-C of the emission control lines EL7 and EL8.

Areas 1A and 3A of the second non-display area NDA2 may correspond to the first outer driving circuit 110 of FIG. 5, and areas 2A and 4A of the second non-display area NDA2 may correspond to the second outer driving circuit 120 of FIG. 5.

One emission control line is arranged on one pixel row. In an embodiment, the first emission control driver ED1 and the second emission control driver ED2 are respectively arranged in the areas 1A and 2A on the left and right of the second non-display area NDA2 collectively corresponding to four pixel rows. The third emission control driver ED3 and the fourth emission control driver ED4 are respectively arranged in the areas 3A and 4A on the left and right of the second non-display area NDA2 collectively corresponding to the next four pixel rows.

The present embodiment may minimize the number of emission control drivers. Since the number of emission control drivers is minimized, a space occupied by emission control drivers may be advantageously minimized. Additional drivers may be further arranged in the areas 1A, 2A, 3A, and 4A. Advantageously, utilization of the non-display area may be optimized.

Figure 11:
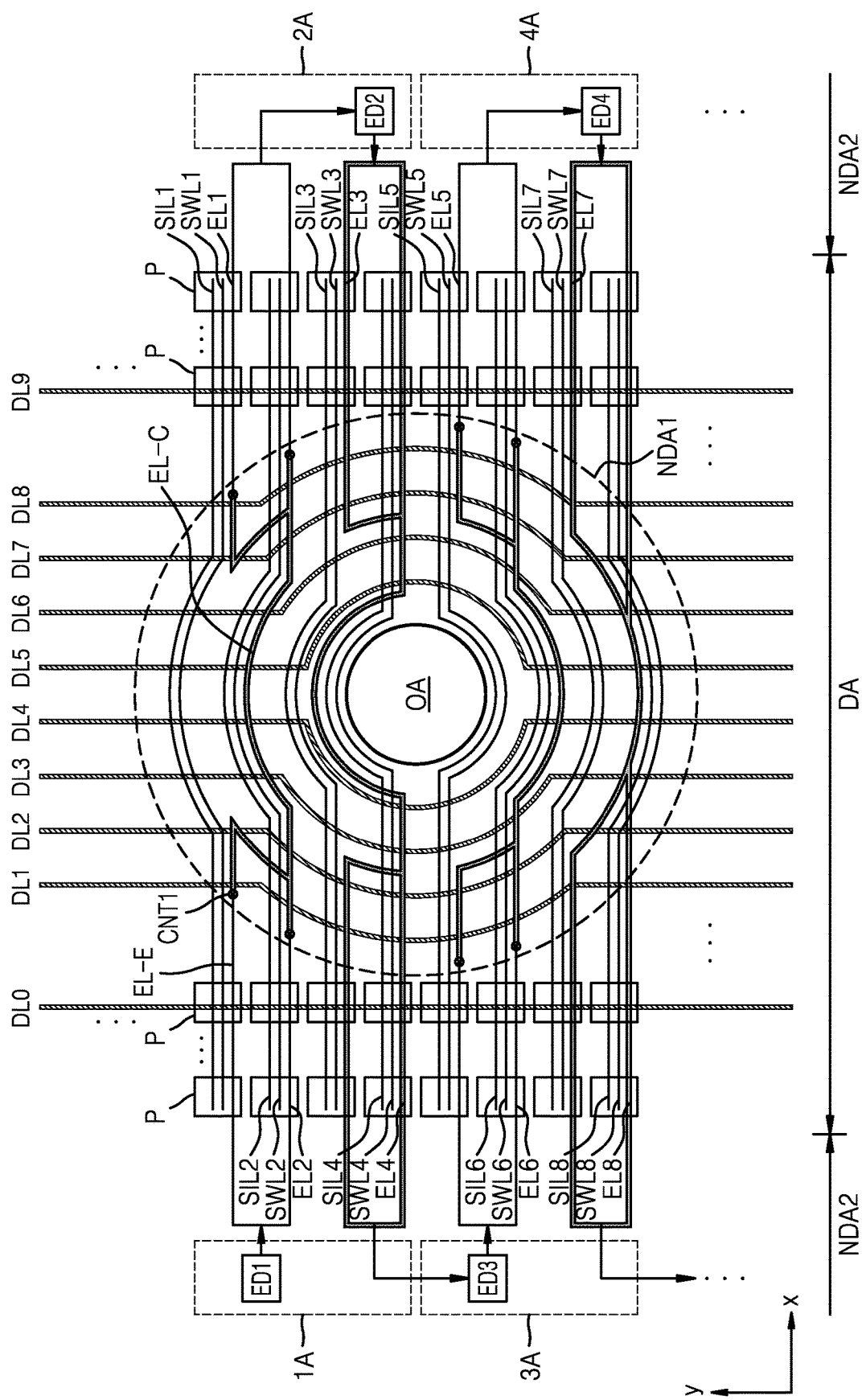
FIG. 11 is a plan view of at least an emission control line and an emission control driver of a display panel according to another embodiment.
Figure 12:
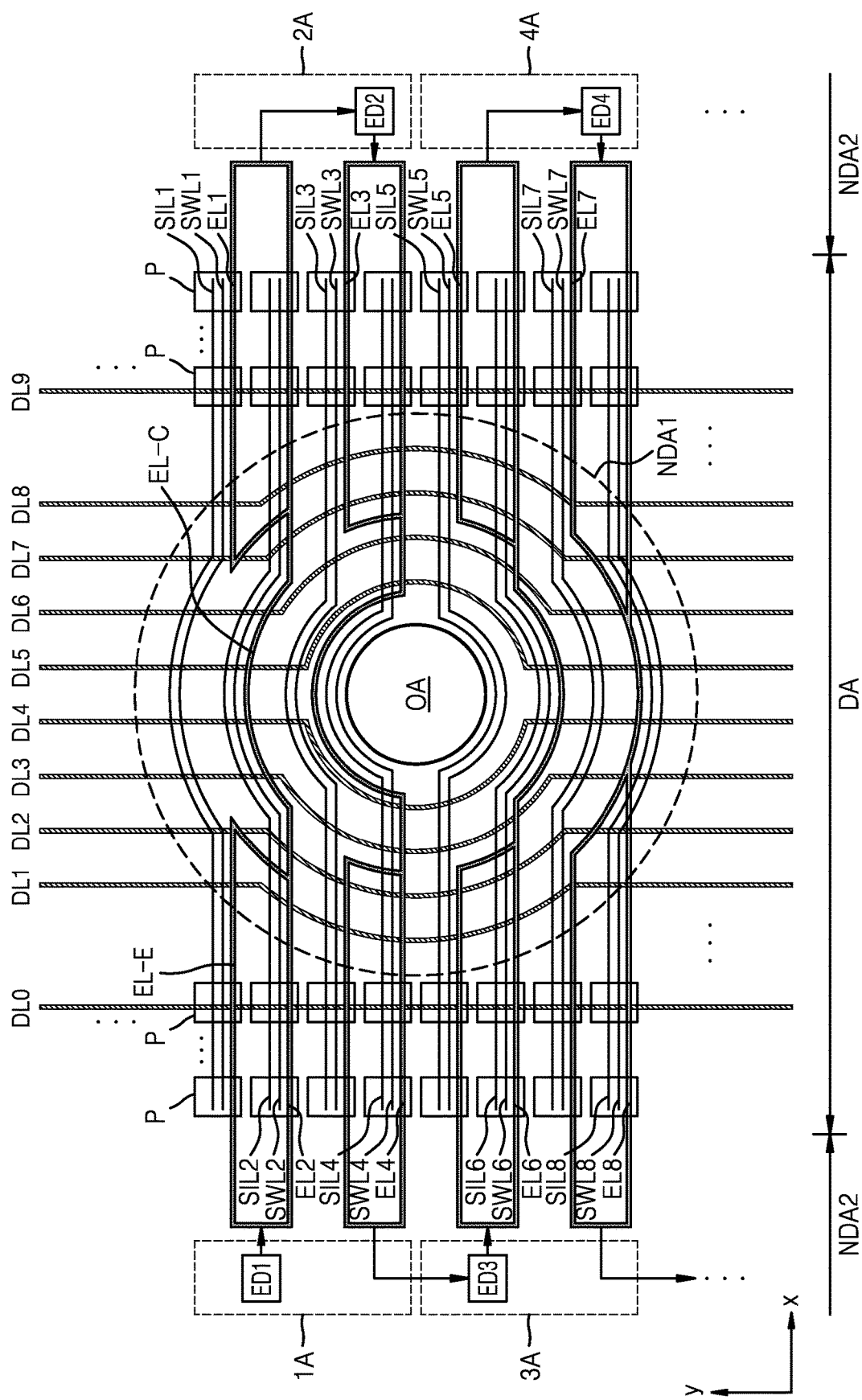
FIG. 12 is a plan view of at least an emission control line and an emission control driver of a display panel according to another embodiment.
Figure 13:
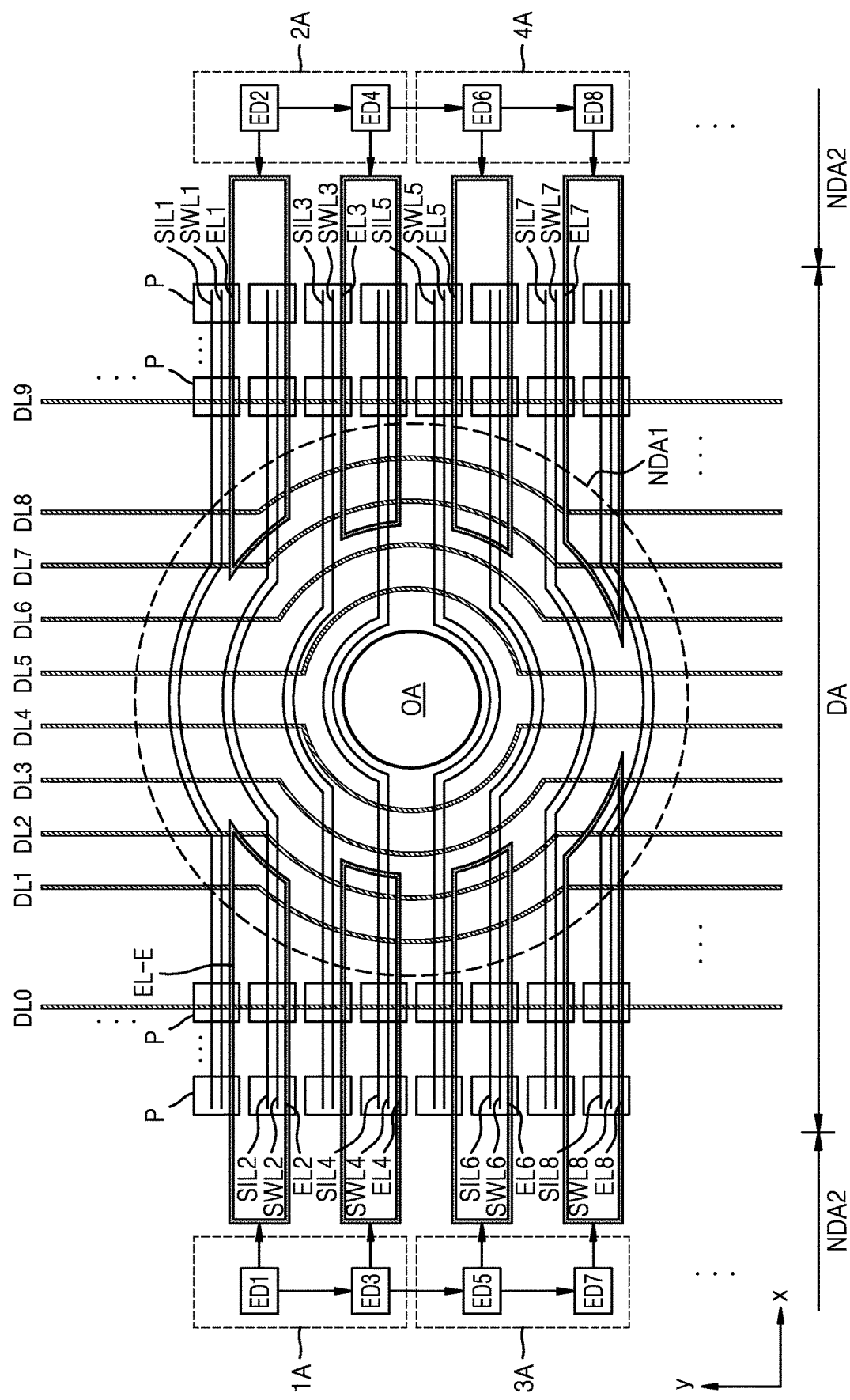
FIG. 13 is a plan view of at least an emission control line and an emission control driver of a display panel according to another embodiment.

FIGS. 11 to 13 are plan views of at least an emission control line and an emission control driver of a display panel according to embodiments. Features that are different from above-described features are mainly described.

Referring to FIG. 11, when compared with the display panel of FIG. 10, structures of the emission control lines EL3 and EL4 and the emission control lines EL7 and EL8 are different. In the structures of FIG. 10, the extension portions (also referred to as connection portions) EL-E and the detour lines EL-C are not arranged on the same layer and are connected to each other through the first contact hole CNT1 of the intervening insulating layer. In contrast, the connection portions EL-E and the detour lines EL-C of the emission control lines EL3 and EL4 and the emission control lines EL7 and EL8 of the present embodiment of FIG. 11 are provided on the same layer. That is, the embodiment of FIG. 11 may include emission control lines provided on different layers and connected through the contact hole and may include emission control lines provided on the same layer.

Referring to FIG. 12, the connection portions EL-E and the detour lines EL-C of all the emission control lines EL1, EL2, EL3, EL4, EL5, EL6, EL7, and EL8 are formed on the same layer. Since all the emission control lines include the same material and may be formed using the same mask process, the process may be simplified.

Referring to FIG. 13, the detour line EL-C shown in FIG. 10 is not formed.

The emission control lines EL1 and EL2 on the left of the opening area OA are connected to each other, and the emission control lines EL1 and EL2 on the right of the opening area OA are connected to each other. Since there is no detour line EL-C, the emission control lines EL1 and EL2 on the left of the opening area OA are electrically isolated from the emission control lines EL1 and EL2 on the right of the opening area OA. Likewise, the emission control lines EL3 and EL4, the emission control lines EL5 and EL6, and the emission control lines EL7 and EL8 do not include the detour line EL-C connecting the left and right of the opening area OA.

In the present embodiment, since the detour line EL-C is not formed, the display panel may include emission control drivers ED1, ED2, ED3, ED4, ED5, ED6, ED7, and ED8.

The first emission control driver ED1 arranged on the left of the second non-display area NDA2 may simultaneously provide first emission control signals to the emission control lines EL1 and EL2, and the signals may be provided to pixels P arranged on the left of the opening area OA through the extension portion EL-E of the emission control lines EL1 and EL2.

The first emission control signal output from the first emission control driver ED1 may be transferred, as a carry signal, to the third emission control driver ED3 arranged on the left of the second non-display area NDA2. The third emission control driver ED3 may simultaneously provide second emission control signals to the emission control lines EL3 and EL4, and the signals may be provided to pixels P arranged on the left of the opening area OA through the extension portion EL-E of the emission control lines EL3 and EL4.

Likewise, the second emission control signal output from the third emission control driver ED3 may be transferred, as a carry signal, to the fifth emission control driver ED5 arranged on the left of the second non-display area NDA2. The fifth emission control driver ED5 may simultaneously provide third emission control signals to the emission control lines EL5 and EL6, and the signals may be provided to pixels P arranged on the left of the opening area OA through the extension portion EL-E of the emission control lines EL5 and EL6.

The third emission control signal output from the fifth emission control driver ED5 may be transferred, as a carry signal, to the seventh emission control driver ED7 arranged on the left of the second non-display area NDA2. The seventh emission control driver ED7 may simultaneously provide emission control signals to the emission control lines EL7 and EL8, and the signals may be provided to pixels P arranged on the left of the opening area OA through the extension portion EL-E of the emission control lines EL7 and EL8.

The second emission control driver ED2 arranged on the right of the second non-display area NDA2 may simultaneously provide first emission control signals to the emission control lines EL1 and EL2, and the signals may be provided to pixels P arranged on the right of the opening area OA through the extension portion EL-E of the emission control lines EL1 and EL2.

The first emission control signal output from the second emission control driver ED2 may be transferred, as a carry signal, to the fourth emission control driver ED4 arranged on the right of the second non-display area NDA2. The fourth emission control driver ED4 may simultaneously provide second emission control signals to the emission control lines EL3 and EL4, and the signals may be provided to pixels P arranged on the right of the opening area OA through the extension portion EL-E of the emission control lines EL3 and EL4.

Likewise, the second emission control signal output from the fourth emission control driver ED4 may be transferred, as a carry signal, to the sixth emission control driver ED6 arranged on the right of the second non-display area NDA2. The sixth emission control driver ED6 may simultaneously provide third emission control signals to the emission control lines EL5 and EL6, and the signals may be provided to pixels P arranged on the right of the opening area OA through the extension portion EL-E of the emission control lines EL5 and EL6.

The third emission control signal output from the seventh emission control driver ED7 may be transferred, as a carry signal, to the eighth emission control driver ED8 arranged on the right of the second non-display area NDA2. The eighth emission control driver ED8 may simultaneously provide fourth emission control signals to the emission control lines EL7 and EL8, and the signals may be provided to pixels P arranged on the right of the opening area OA through the extension portion EL-E of the emission control lines EL7 and EL8.

According to the above embodiment, the first non-display area NDA1 may be minimized through minimizing the number of detour lines EL-C around the opening area OA.

FIGS. 14 to 17 are plan views of at least a scan line, a previous scan line, and a scan driver of the display panel 10 according to embodiments. Features different from above-described features are mainly described.

Figure 14:
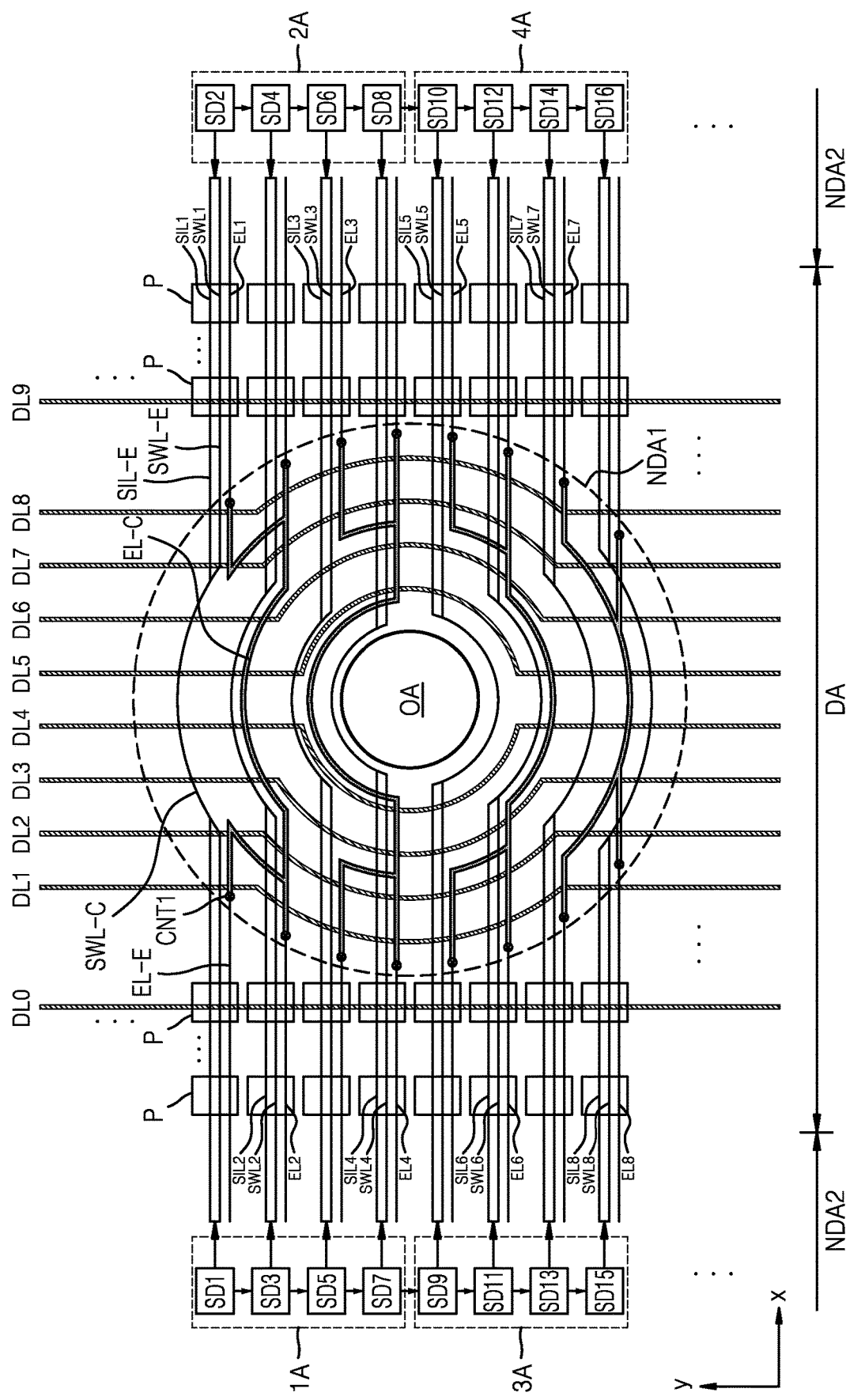
FIG. 14 is a plan view of at least a scan line, a previous scan line, and a scan driver of a display panel according to another embodiment.

Referring to FIG. 14, scan drivers SD1, SD2, SD3, SD4, SD5, SD6, SD7, SD8, SD9, SD10, SD11, SD12, SD13, SD14, SD15, and SD16 are arranged in the second non-display area NDA2. The structures of the emission control lines EL1, EL2, EL3, EL4, EL5, EL6, EL7, and EL8 are the same as those of the embodiment of FIG. 10. Though not shown in FIG. 14, emission control drivers configured to provide emission control signals to the emission control lines EL1, EL2, EL3, EL4, EL5, EL6, EL7, and EL8 may be the same as the emission control drivers ED1, ED2, ED3, and ED4 shown in FIG. 10.

In the embodiment of FIG. 10, each of the scan lines SWL0, SWL1, SWL2, SWL3, SWL4, SWL5, SWL6, SWL7, SWL8, and SWL9, and the previous scan lines SIL0, SIL1, SIL2, SIL3, SIL4, SIL5, SIL6, SIL7, SIL8, and SIL9 may substantially extend in the x-direction and detour around the opening area OA. According to the present embodiment of FIG. 14, one scan line and one previous scan line included in one pixel row are connected to each other, and one detour line SWL-C connecting the scan line and the previous scan line is provided.

For example, in the first non-display area NDA1, the first previous scan line SIL1 is connected to the detour line SWL-C of the first scan line SWL1. In other words, the first previous scan line SIL1 and the first scan line SWL1 share the detour line SWL-C. Likewise, each of groups ranging from a group including the second previous scan line SIL2 and the second scan line SWL2 to a group including the eighth previous scan line SIL8 and the eighth scan line SWL8 includes only one detour line SWL-C. Advantageously, the first non-display area NDA1 around the opening area OA may be minimized.

The scan drivers SD1, SD2, SD3, SD4, SD5, SD6, SD7, SD8, SD9, SD10, SD11, SD12, SD13, SD14, SD15, and SD16 are arranged in the second non-display areas on two opposite sides of the second non-display area NDA2, and two scan drivers may be connected to one pixel row with pixels located on two opposite sides of the opening area OA.

For example, the first scan driver SD1 arranged on the left of the second non-display area NDA2 and the second scan driver SD2 arranged on the right of the second non-display area NDA2 simultaneously provide scan signals to the first previous scan line SIL1 and the first scan line SWL1. The third scan driver SD3 arranged on the left of the second non-display area NDA2 and the fourth scan driver SD4 arranged on the right of the second non-display area NDA2 simultaneously provide scan signals to the second previous scan line SIL2 and the second scan line SWL2. Likewise, the fifteenth scan driver SD15 arranged on the left of the second non-display area NDA2 and the sixteenth scan driver SD16 arranged on the right of the second non-display area NDA2 simultaneously provide scan signals to the eighth previous scan line SIL8 and the eighth scan line SWL8. Since scan signals are simultaneously provided from the left and right of the display area DA, a scan signal delay may be prevented and thus display quality may be improved.

Four scan drivers are arranged in each of the areas 1A, 2A, 3A, and 4A. Since the number of emission control drivers ED1, ED2, ED3, and ED4 (see FIG. 10) arranged in each of the areas 1A, 2A, 3A, and 4A is small, a sufficient number of scan drivers may be arranged in each of the areas 1A, 2A, 3A, and 4A.

A material of a connected pair of a scan line and a previous scan line may be different from a material of an immediately adjacent connected pair of a scan line and a previous scan line.

Figure 15:
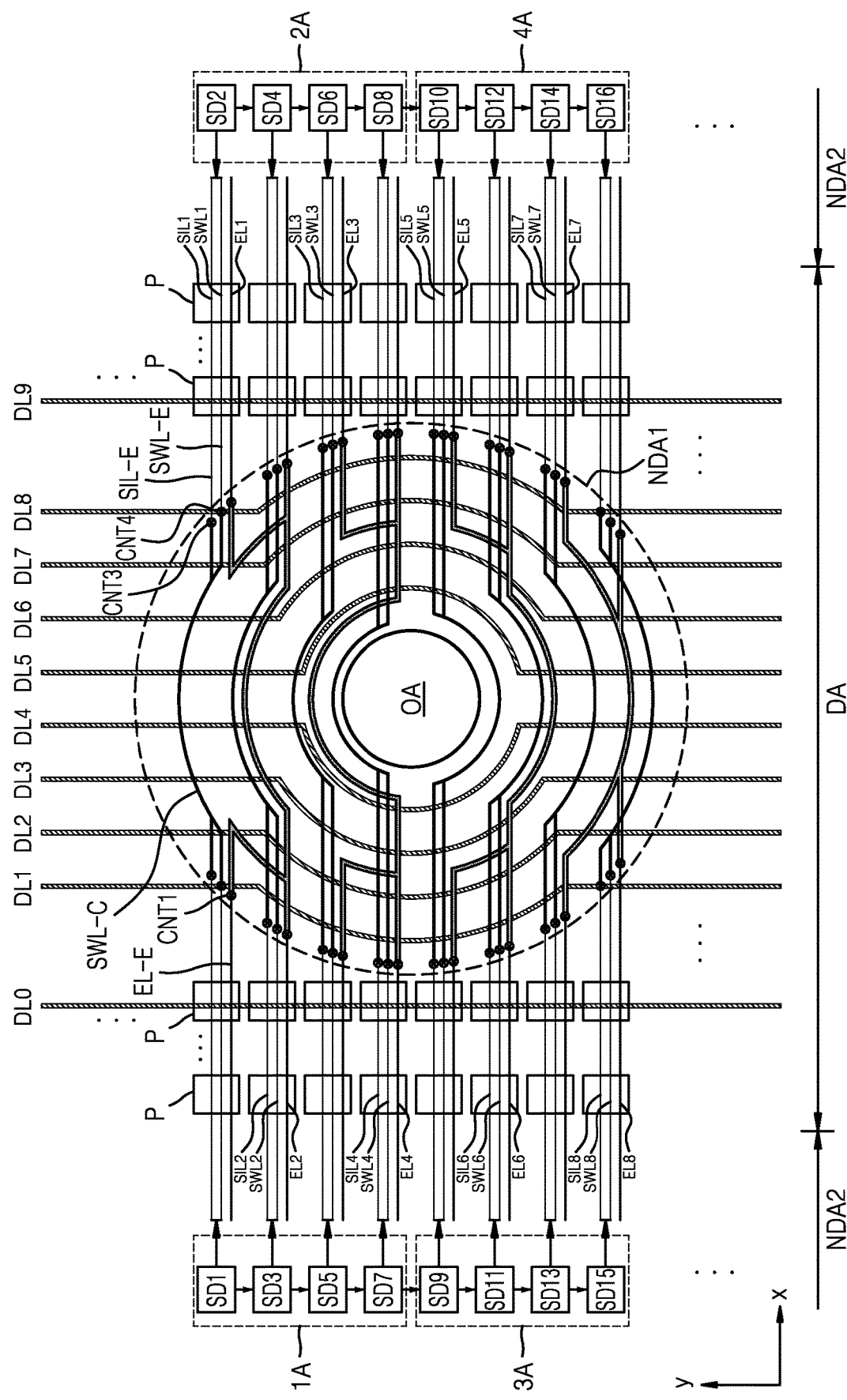
FIG. 15 is a plan view of at least a scan line, a previous scan line, and a scan driver of a display panel according to another embodiment.

Referring to FIG. 15, when compared with the display panel 10 of FIG. 14, structures of the scan lines and the previous scan lines are different. In the display panel 10 of FIG. 14, all of the scan lines and the previous scans line are formed on the same layer. In the display panel 10 of the present embodiment of FIG. 15, the first scan line SWL1 and the first previous scan line SIL1 are connected to each other through a detour line SWL-C. The detour line SWL-C, the connection portion SWL-E of the first scan line, and the connection portion SIL-E of the first previous scan line are arranged in different layers with at least an intervening insulating layer and are connected through contact holes CNT3 and CNT4.

Figure 16:
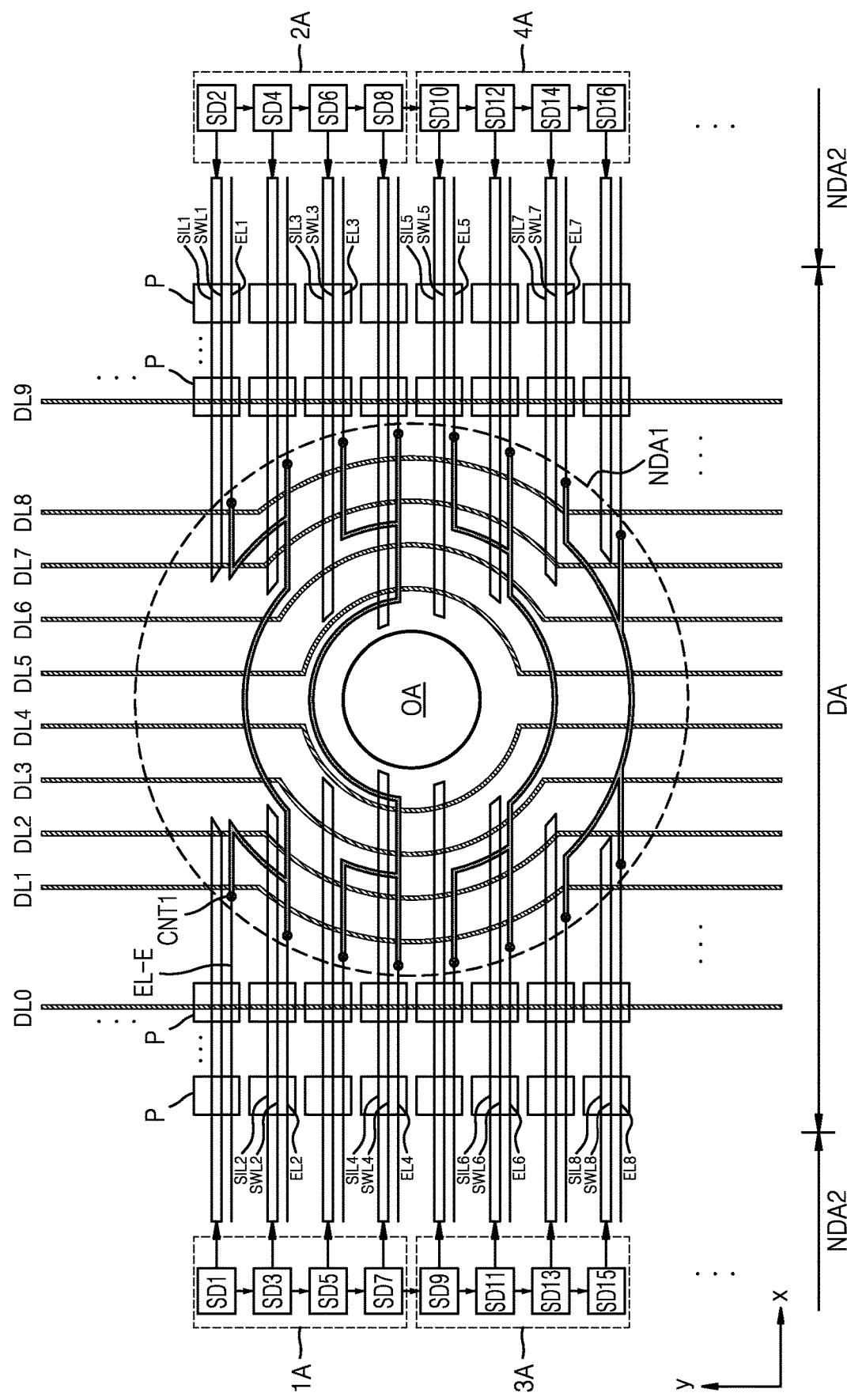
FIG. 16 is a plan view of at least a scan line, a previous scan line, and a scan driver of a display panel according to another embodiment.

Referring to FIG. 16, the detour line SWL-C shown in FIG. 14 is not formed. The first non-display area NDA1 may be advantageously minimized through minimizing the number of detour lines SWL-C around the opening area OA.

Figure 17:
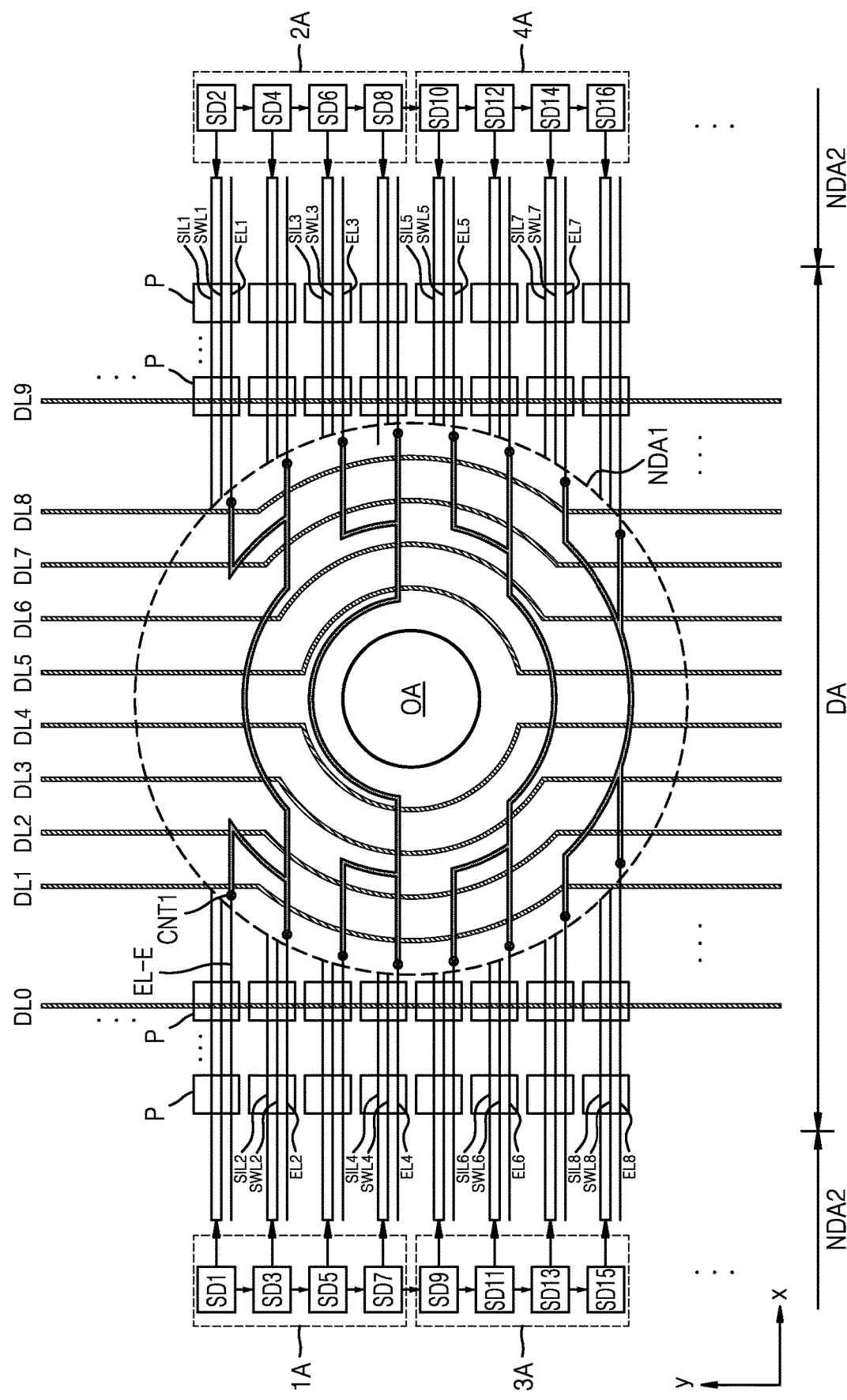
FIG. 17 is a plan view of at least a scan line, a previous scan line, and a scan driver of a display panel according to another embodiment.

Referring to FIG. 17, a scan line and a pairing previous scan line may be disconnected at a perimeter of the first non-display area relatively close to the opening area OA. The scan lines SWL1, SWL2, SWL3, SWL4, SWL5, SWL6, SWL7, and SWL8, and the previous scan lines SIL1, SIL2, SIL3, SIL4, SIL5, SIL6, SIL7, and SIL8 that have extended to the display area DA from the left and right portions of the second non-display area NDA2 may not extend into the first non-display area NDA1. By minimizing the number of wirings arranged in the first non-display area NDA1, the first non-display area NDA1 may be advantageously minimized.

According to embodiments, the area of the non-display area NDA may be minimized by minimizing the number of detour line connecting lines in the first non-display area NDA1 around the opening area OA in a display device 1.

Although example embodiments have been described with reference to the drawings, various changes in form and details and equivalents may be made without departing from the scope defined by the following claims.

What is claimed is:
1. A display panel comprising:
   a substrate including an opening area, a display area surrounding at least a part of the opening area, a first non-display area between the opening area and the display area, and a second non-display area outside the display area;
   a first data line positioned at a first side relative to the opening area in a plan view of the display panel;
   a second data line positioned at a second side relative to the opening area in the plan view of the display panel, wherein the opening area is positioned between the first data line and the second data line;
a first scan line;
a second scan line;
a first pixel electrically connected to each of the first data line and the first scan line;
a second pixel electrically connected to each of the first data line and the second scan line;
a third pixel electrically connected to each of the second data line and the first scan line; and
a fourth pixel electrically connected to each of the second data line and the second scan line,
a first emission control line electrically connected to the first pixel;
a first connecting section positioned on the first non-display area;
a second emission control line electrically connected to the second pixel and electrically connected through the first connecting section to the first emission control line;
a first opposite emission control line electrically connected to the third pixel;
a first opposite connecting section positioned opposite the first connecting section and positioned on the first non-display area; and
a second opposite emission control line electrically connected to the fourth pixel and electrically connected through the first opposite connecting section to the first opposite emission control line.

2. The display panel of claim 1, further comprising:
a first emission control detour section electrically connecting the second emission control line and the second opposite emission control line, and wherein the first emission control detour section bypasses the opening area.

3. The display panel of claim 2, further comprising:
a third data line, which includes a first data detour section, the first data detour section bypassing the opening area and being positioned on the first non-display area; and
a fourth data line, which includes a second data detour section, the second data detours section bypassing the opening area and being positioned on the first non-display area,
wherein the first emission control detour section is arranged between the first data detour section and a second data detour section.

4. The display panel of claim 2, further comprising:
a first insulating layer having a first contact hole,
wherein the second emission control line further comprises a first pixel-connecting section, and wherein the first emission control detour section is connected to the first pixel-connecting section through the first contact hole and is electrically connected to the second pixel through the first pixel-connecting section.

5. The display panel of claim 4, further comprising: a second insulating layer having a second contact hole, and wherein the first emission control detour section is connected to the first pixel-connecting section through the first contact hole and the second contact hole.

6. The display panel of claim 2, further comprising:
a first insulating layer having a first contact hole,
wherein the second opposite emission control line further comprises a first opposite pixel-connecting section, and wherein the first opposite emission control detour section is connected to the first pixel-connecting section through the first contact hole and is electrically connected to the second pixel through the third pixel-connecting section.

7. The display panel of claim 2, further comprising: a first insulating layer, wherein the second emission control line further comprises a first pixel-connecting section, and wherein the first emission control detour section is electrically connected to the second pixel through the first pixel-connecting section, and wherein the first emission control detour section and the first pixel-connecting section directly contact a same face of the first insulating layer.

8. The display panel of claim 7, wherein a material of the first emission control detour section is identical to a material of the first pixel-connecting section.

9. The display panel of claim 2, further comprising: a first insulating layer, wherein the second opposite emission control line further comprises a first opposite pixel-connecting section, and wherein the first emission control detour section is electrically connected to the fourth pixel through the first pixel-connecting section, and wherein the first emission control detour section and the first pixel-connecting section directly contact a same face of the first insulating layer.

10. The display panel of claim 9, wherein a material of the first emission control detour section is identical to a material of the first opposite pixel-connecting section.

11. The display panel of claim 2, further comprising:
a first emission control driver positioned on the second non-display area; and
a second emission control driver positioned on the second non-display area and separated from the first emission control driver,
wherein the first emission control driver is electrically connected to four adjacent emission control lines positioned at the first side relative to the opening display area, and wherein the second emission control driver is electrically connected to four adjacent opposite emission control lines positioned at the second side relative to the opening area.

12. The display panel of claim 1, wherein the second emission control line and the second opposite emission control line are electrically disconnected from each other.

13. The display panel of claim 12, wherein the first emission control line and the first opposite emission control line directly contact a same surface of an insulating layer, and wherein a material of the first emission control line is identical to a material of the first opposite emission control line.

14. The display panel of claim 12, further comprising:
a first emission control driver positioned on the second non-display area and configured to simultaneously provide signals to the first emission control line and the second emission control line; and
a second emission control driver positioned on the second non-display area and configured to simultaneously supply signals to the first opposite emission control line and the second opposite emission control line.

15. The display panel of claim 12, wherein each of the first connecting section and the first opposite connecting section conforms to an arc of a geometric circle, and wherein the geometric circle is concentric with a perimeter the opening area in the plan view of the display panel.

16. The display panel of claim 1, further comprising:
a first opposite scan line positioned opposite the first scan line, wherein the opening area is positioned between the first scan line and the first opposite scan line;
a first previous scan line electrically connected to the first pixel; and a first opposite previous scan line positioned opposite the first previous scan line and electrically connected to each of the third pixel, wherein the opening area is positioned between the first previous scan line and the first opposite previous scan line.

17. The display panel of claim 16, further comprising: further comprising:
   a first scan detour section connecting the first scan line and the first opposite scan line, wherein the first scan detour section bypasses the opening area; and
   a first previous scan detour section connecting the first previous scan line and the first opposite previous scan line, wherein the first scan detour section bypasses the opening area and is separated from the first scan detour section.

18. The display panel of claim 16, further comprising: further comprising:
   a first scan connecting section connecting the first scan line and the first previous scan line;
   a first opposite scan connecting section connecting the first opposite scan line and the first opposite previous scan line; and
   a first scan detour section bypassing the opening area and connecting the first scan connecting section and the first opposite scan connecting section.

19. The display panel of claim 18, wherein the first scan connecting section, the first opposite scan connecting section, and the first scan detour section directly contact a same surface of an insulating layer.

20. The display panel of claim 18, further comprising: an insulating layer having a contact hole,
wherein the first scan detour section is electrically connected to the first scan connecting section and the first opposite scan connecting section through the contact hole.

21. The display panel of claim 16, further comprising:
   a first scan connecting section connecting the first scan line and the first previous scan line; and
   a first opposite scan connecting section connecting the first opposite scan line and the first opposite previous scan line,
wherein the first scan detour section and the first opposite scan connecting section are spaced apart from each other and are electrically disconnected from each other.

22. The display panel of claim 1, further comprising:
   a first opposite scan line positioned opposite the first scan line, wherein the opening area is positioned between the first scan line and the first opposite scan line;
   a first previous scan line; and
   a first opposite previous scan line positioned opposite the first previous scan line, wherein the opening area is positioned between the first previous scan line and the first opposite previous scan line,
wherein an end of the first scan line close to the opening area and an end of the first previous scan line close to the opening area are spaced apart from each other and electrically disconnected from each other, and
wherein an end of the first opposite scan line close to the opening area and an end of the first opposite previous scan line close to the opening area are spaced apart from each other and electrically disconnected from each other.

\* \* \* \* \*